(12) United States Patent
Shirai et al.

(10) Patent No.: US 7,659,144 B2
(45) Date of Patent: Feb. 9, 2010

(54) SEMICONDUCTOR DEVICE AND MANUFACTURING THE SAME

(75) Inventors: Nobuyuki Shirai, Tokyo (JP); Ryotaro Kudo, Tokyo (JP); Yukihiro Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 466 days.

(21) Appl. No.: 11/618,188

(22) Filed: Dec. 29, 2006

(65) Prior Publication Data

US 2007/0196950 A1 Aug. 23, 2007

(30) Foreign Application Priority Data

Feb. 21, 2006 (JP) ............................. 2006-043293

(51) Int. Cl.
*H01L 21/00* (2006.01)

(52) U.S. Cl. ................ 438/107; 438/109; 257/E25.026

(58) Field of Classification Search ................ 438/107, 438/109; 257/E25.03, E25.023, E25.025, 257/E25.026
See application file for complete search history.

(56) References Cited

U.S. PATENT DOCUMENTS 6,208,525 B1 * 3/2001 Imasu et al. ................. 361/783
6,548,328 B1 * 4/2003 Sakamoto et al. ........... 438/121
7,589,405 B2 * 9/2009 Son et al. .................... 257/678
2003/0057544 A1 * 3/2003 Nathan et al. ............... 257/700
2005/0181543 A1 * 8/2005 Lee et al. .................... 438/127
2007/0102807 A1 * 5/2007 Pohl ........................... 257/700

FOREIGN PATENT DOCUMENTS

| JP | 11-31775 | 2/1999 |
| JP | 2001-320009 | 11/2001 |
| JP | 2002-83927 | 3/2002 |
| JP | 2005-93762 | 4/2005 |

\* cited by examiner

*Primary Examiner*—David A Zarneke
(74) *Attorney, Agent, or Firm*—Mattingly & Malur, P.C.

(57) ABSTRACT

Disclosed is a semiconductor device which makes it easy to design a wiring pattern for a wiring substrate on which the semiconductor device is to be mounted. In manufacturing plural semiconductor devices for providing different amounts of output current, arrangements and numbers of leads to which semiconductor chips for power transistors of the semiconductor devices are to be electrically connected are changed according to output current requirements for the semiconductor devices, whereas arrangements and numbers of leads to which semiconductor chips for control circuits of the semiconductor devices are to be electrically connected are fixed to be common to the semiconductor devices. In this way, the probability of malfunction of control circuits (PWM circuits) of the semiconductor devices can be reduced, so that a semiconductor device which makes it easy to design a wiring pattern for a wiring substrate on which the semiconductor device is to be mounted can be provided.

10 Claims, 28 Drawing Sheets

US 7,659,144 B2

SEMICONDUCTOR DEVICE AND MANUFACTURING THE SAME

CROSS-REFERENCE TO RELATED APPLICATION

The present application claims priority from Japanese patent application No. 2006-43293 filed on Feb. 21, 2006, the content of which is hereby incorporated by reference into this application.

BACKGROUND OF THE INVENTION

The present invention relates to a method of manufacturing a semiconductor device and semiconductor device technology. More particularly, it relates to technology which is effectively applicable to a DC/DC converter.

A DC/DC converter widely used as a power supply circuit has a configuration in which a power MOSFET for a high-side switch and a power MOSFET for a low-side switch are connected in series. The power MOSFET for a high-side switch has a switching function for controlling the DC/DC converter. The power MOSFET for a low-side switch has a switching function for performing synchronous rectification. The two power MOSFETs are synchronously and alternately turned on and off to carry out supply voltage conversion.

For example, a configuration in which a switching element (power MOSFET or IGBT) (6) and a control element (7) to control the switching element are contained in a same package is disclosed in Japanese Unexamined Patent Publication No. 2001-320009 (patent document 1) (see FIGS. 1 and 2). The control element (7) includes no element for a PWM (Pulse Width Modulation) circuit.

Also, a configuration in which a power switching element (power MOSFET or IGBT) (10) and a control element (11) to control the power switching element are contained in a same package is disclosed in Japanese Unexamined Patent Publication No. 2002-83927 (patent document 2) (see FIGS. 1 and 2). The control element (11) includes no element for a PWM circuit.

Furthermore, a configuration in which a power MOSFET (3) and an IC chip (4) having a control function are sealed in a same resin molded section is disclosed in Japanese Unexamined Patent Publication No. Hei 11(1999)-31775 (patent document 3) (see FIG. 1). No concrete description of the internal configuration of the IC chip (4) is provided in the patent document 3.

Still furthermore, a configuration in which power transistors (3 and 4) and a driver IC (2) to refine control signals inputted to the control terminals of the power transistors are installed in a same package is disclosed in Japanese Unexamined Patent Publication No. 2005-93762 (patent document 4) (see FIG. 1).

SUMMARY OF THE INVENTION

The present inventors have been working to develop a semiconductor device with a configuration in which a power transistor circuit for a DC/DC converter and control circuits (a driver circuit and a PWM (Pulse Width Modulation) circuit) to control the power transistor circuit are contained in a package. In the development work, the present inventors have found the following problem to be solved.

Requirements, for example, as to output voltage, output current, and switching frequency to be met by the semiconductor device that the present inventors have been working to develop vary with the type of a load (for example, memory, logic IC, or FPGA) to be connected to the semiconductor device, so that it is necessary to prepare a lineup of semiconductor devices compatible with different types of loads. Changing the arrangement of a power transistor circuit and a control circuit included in each semiconductor device according to the type of a load to be connected thereto causes the arrangement of external terminals with which the semiconductor device is provided to be also changed. Since the semiconductor device is to be installed, after being mounted on a wiring substrate, in an electronic device such as a power supply system, the wiring pattern on the wiring substrate also requires to be changed according to the arrangement of external terminals of the semiconductor device. This may cause the control circuit included in the semiconductor device to malfunction depending on the wiring pattern layout on the wiring substrate.

An object of the present invention is to provide technology applicable to realize a semiconductor device which makes it easy to design a wiring pattern for a wiring substrate on which the semiconductor device is to be mounted.

The above and other objects of the present invention and novel features thereof will become apparent from the present specification and the accompanying drawings.

Representative ones of the inventions disclosed in the present application are summarized as follows.

In preparing a lineup of semiconductor devices with a configuration in which a power transistor circuit and a control circuit to control the power transistor circuit are contained in a same package, external terminals, electrically connected to the control circuit, of the semiconductor devices are arranged to be common to all the semiconductor devices.

Namely, the present invention provides a semiconductor device which makes it easy to design a wiring pattern for a wiring substrate on which the semiconductor device is to be mounted.

DETAILED DESCRIPTION OF THE PREFERRED EMBODIMENTS

In the following, the present invention will be described, if necessary for convenience sake, by dividing an embodiment into plural sections or by making reference to plural embodiments. Unless otherwise stated explicitly, such plural sections or plural embodiments are not mutually irrelevant. Among them, one, for example, provides partial or total modification, details, or supplementary description of another. When, in the following description of embodiments, a value or number (for example, a quantity, a numeric value, volume, or a range) is specified in terms of any element, the value or number is not limited to the specified one unless otherwise stated explicitly or unless obviously regarded otherwise in principle. It may be smaller or greater. Furthermore, the components (including elementary steps) used in the following embodiments are not necessarily essential unless otherwise stated explicitly or unless obviously regarded otherwise in principle. Similarly, the shapes of components or positional relationships between components described for the following embodiments include those substantially identical or analogous to the described ones unless otherwise stated explicitly or unless obviously regarded otherwise in principle. This also applies to the value or number mentioned above. Also, in all the drawings referred to in the following description, components having identical functions are assigned identical reference symbols, and repeating descriptions of such identical components is avoided where possible. In the following, the preferred embodiments of the present invention will be described in detail based on the accompanying drawings.

First Embodiment

Figure 1:
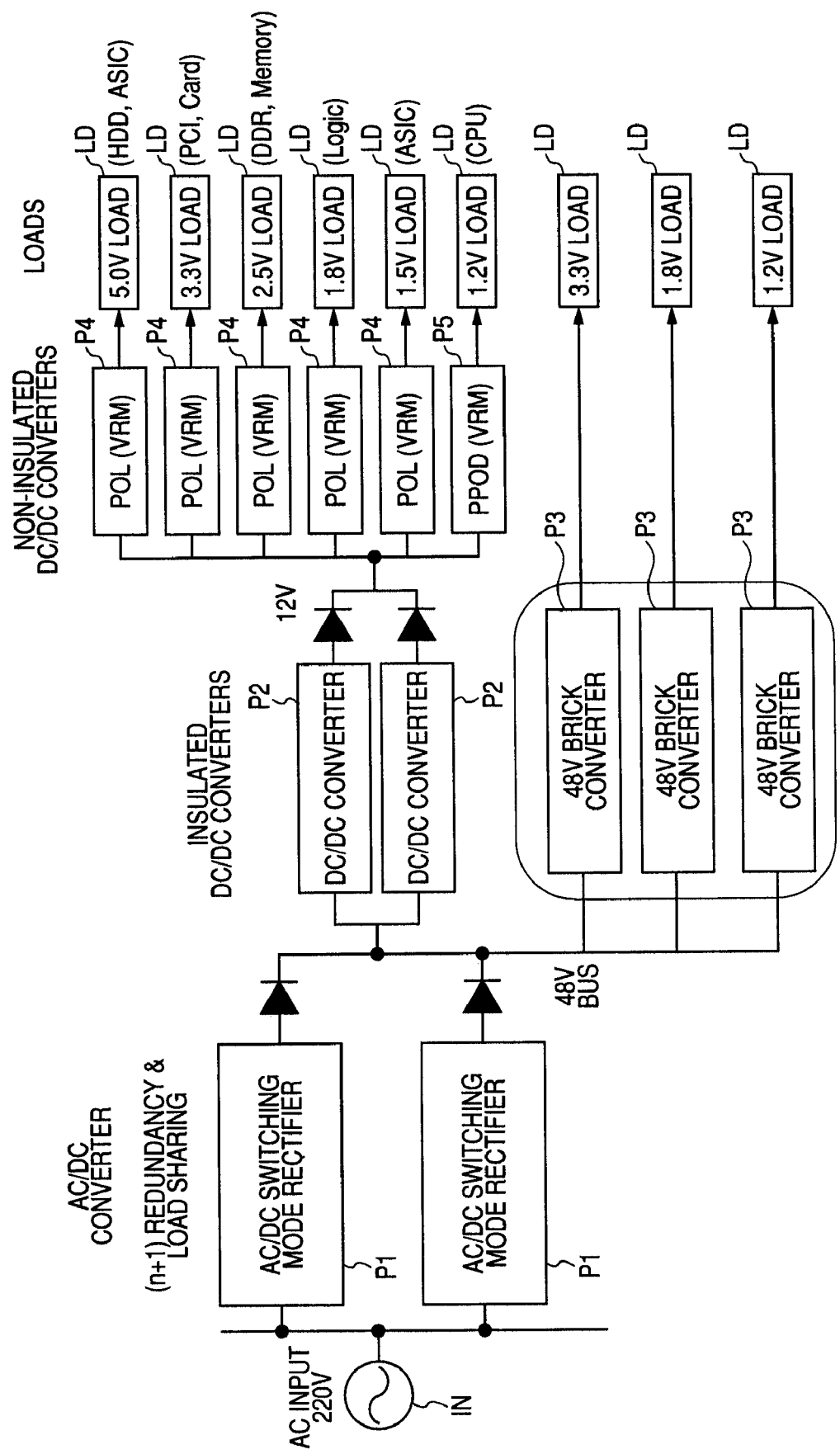
FIG. 1 is a diagram explanatory of a network power supply system including semiconductor devices according to an embodiment of the present invention.

FIG. 1 is a diagram explanatory of a network power supply system (electronic device) including semiconductor devices according to a first embodiment of the present invention.

An input IN is an AC voltage of, for example, 220 V. It is outputted, after being reduced to, for example, 48 V (48 V bus voltage) by AC/DC switching mode rectifiers P1, to insulated DC/DC converters (plural DC/DC converters P2 and plural 48 V brick converters P3).

The supply voltage supplied to the plural DC/DC converters P2 is then supplied, after being reduced to, for example, about 12 V, to downstream non-insulated DC/DC converters (plural POL (Point of Load) power supplies (VRMs: Voltage Regulator Modules) P4 and a PPOD (Power Pod) power supply P5. The plural POL power supplies P4 and PPOD power supply P5 having been given the supply voltage then output voltages reduced as required, for example, to 5.0 V, 3.3 V, 2.5 V, 1.8 V, 1.5 V, and 1.2 V to various types of loads. The loads may include, for example, a hard disk drive (HDD), an ASIC (Application Specific Integrated Circuit), an expansion card (PCI card), a memory (DDR memory), a logic circuit, and a CPU (Central Processing Unit).

The plural POL power supplies P4 and PPOD power supply P5 are mounted on a same printed circuit board (wiring substrate). They are located adjacent to corresponding loads LD to which they supply voltage, respectively.

The voltage supplied to the 48 V brick converters P3, on the other hand, is reduced as required, for example, to 3.3 V, 1.8 V, and 1.2 V. The reduced voltages are then inputted to corresponding loads LD.

Figure 2:
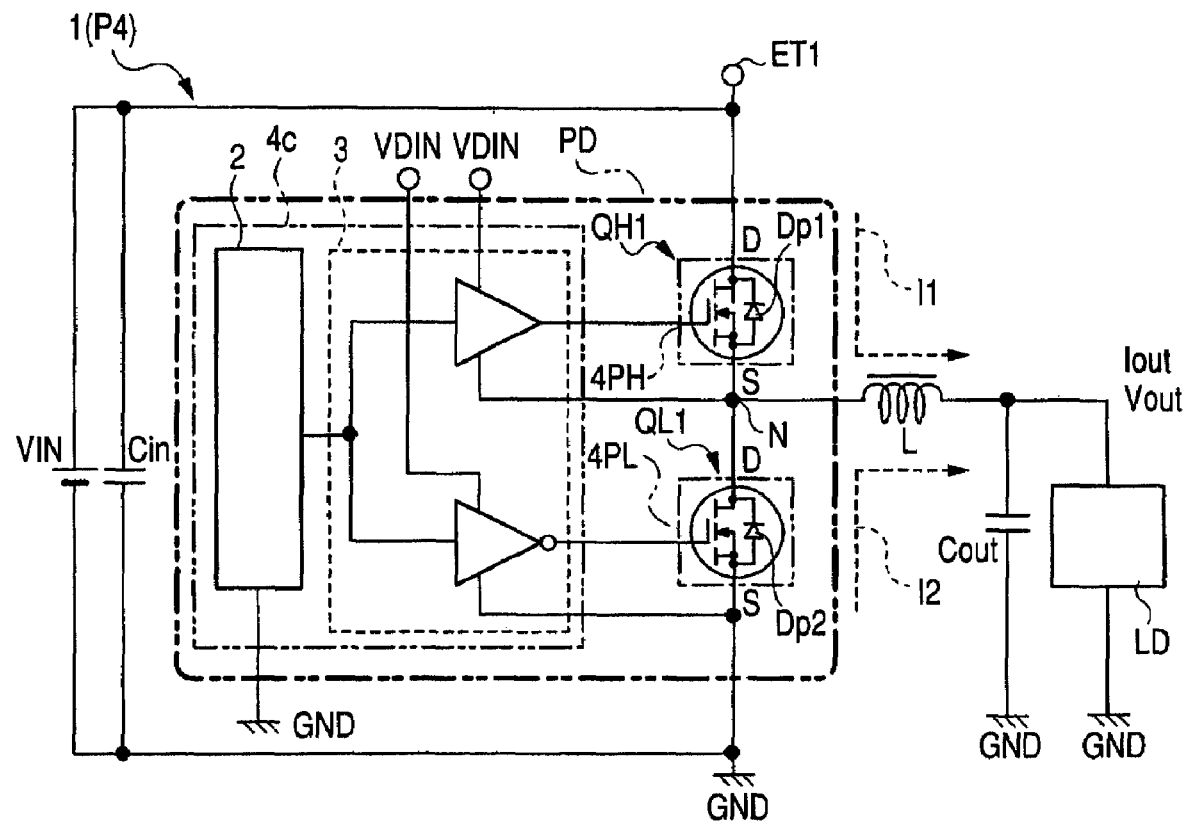
FIG. 2 is a circuit diagram of an example POL power supply including a semiconductor device shown in FIG. 1.
Figure 3:
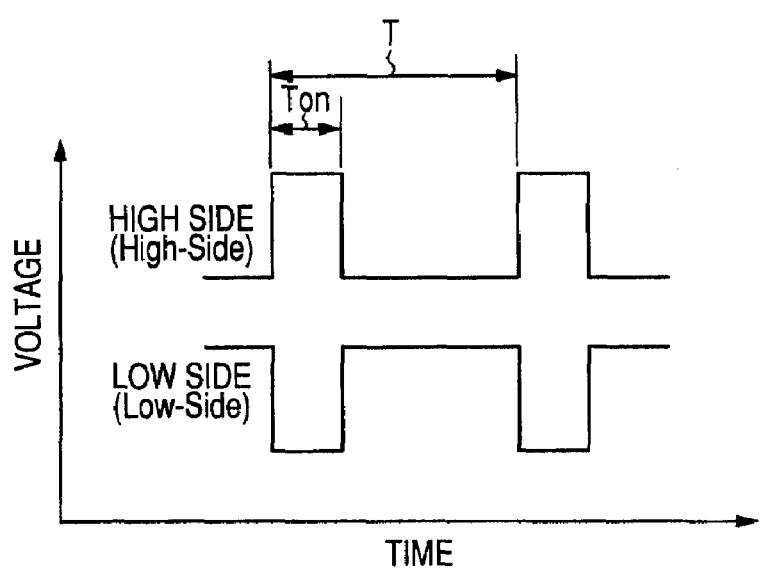
FIG. 3 shows a basic operation waveform of the POL power supply shown in FIG. 2.

FIG. 2 is a circuit diagram of an example of POL power supplies P4 which are semiconductor devices according to the first embodiment of the present invention. FIG. 3 shows a basic operation waveform of the POL power supply P4 shown in FIG. 2.

A non-insulated DC/DC converter 1 making up the POL power supply P4 includes such elements as a semiconductor device PD, an input capacitor Cin, an output capacitor Cout, and a coil L. The semiconductor device PD includes a control circuit 2, a driver circuit 3, and two power MOSFETs (Metal Oxide Semiconductor Field-Effect Transistors; hereinafter referred to simply as "power MOSs") QH1 and QL1. The control circuit 2, driver circuit 3, and power MOSs QH1 and QL1 are sealed (accommodated) in a same package.

The control circuit 2 controls the operation of the power MOSs QH1 and HL1. It includes, for example, a pulse width modulation (PWM) circuit. The pulse width modulation circuit compares the amplitudes of a command signal and a triangular waveform, and outputs a PWM signal (control signal). The PWM signal is used to control the output voltage (namely, the length of on-time of each of the voltage switches of the power MOSs QH1 and QL1) of the power MOSs QH1 and QL1 (i.e. the non-insulated DC/DC converter 1).

The output of the control circuit 2 is electrically connected to the input of the driver circuit 3. The outputs of the driver circuit 3 are electrically connected to the gate terminals of the power MOSs QH1 and QL1, respectively. The driver circuit 3 controls the potentials of the gate terminals of the power MOSs QH1 and QL1 according to the PWM signal supplied from the control circuit 2, and thereby controls the operations of the power MOSs QH1 and QL1.

The control circuit 2 and the driver circuit 3 are, as being described later, formed on a same semiconductor chip 4C. VDIN represents an input power supply for the driver circuit 3. GND represents a reference potential (for example, ground potential of 0 V).

The power MOSs QH1 and QL1 are connected in series between a terminal ET1 (a first power supply terminal) for supplying a high potential (a first power supply potential) of the input power supply VIN and a terminal for supplying a reference potential (a second power supply potential) GND. Namely, whereas the source and drain of the power MOS QH1 are connected in series between the terminal ET1 for supplying the high potential of the input power supply VIN and an output node (output terminal) N, the source and drain of the power MOS QL1 are connected in series between the output node N and the terminal for supplying the reference potential GND. "Dp1" denotes a parasitic diode (internal diode) of the power MOS QH1. "Dp2" denotes a parasitic diode (internal diode) of the power MOS QL1. Symbols "D" and "S" denote the drain and source, respectively, of each of the power MOSs QH1 and QL1.

The power MOS (a first field-effect transistor; power transistor) QH1 is a field-effect transistor for a high-side switch (a high potential side: a first operating voltage; hereinafter referred to simply as the "high side"). It has a switching function for accumulating energy in the coil L. The coil L is an element for supplying power to the output of the non-insulated DC/DC converter 1 (input to a load LD). The power MOS QH1 may be, for example, an n-channel field-effect transistor. In the present example, the field-effect transistor channel is formed in the thickness direction of the semiconductor chip. In this case, compared with a case where a field-effect transistor channel is formed along the principal surface of a semiconductor chip, the channel width per unit area can be increased to reduce the on-resistance. This enables the element to be miniaturized to realize a smaller package. The high-side power MOS QH1 is formed on a semiconductor chip 4PH provided separately from the semiconductor chip 4C.

The power MOS (a second field-effect transistor; power transistor) QL1 is a field-effect transistor for a low-side switch (a low potential side: a second operating voltage; hereinafter referred to simply as the "low side"). It synchronizes with the frequency from the control circuit 2 to reduce the resistance of the transistor and performs rectification. Namely, the power MOS QL1 is a rectifying transistor for the non-insulated D/DC converter 1. The power MOS QL1 is, like the power MOS QH1, an n-channel power MOS whose channel is formed in the thickness direction of the semiconductor chip. The reason why the power MOS whose channel is formed in the thickness direction of the semiconductor chip is used is as follows. As shown in FIG. 3 showing a basic operation waveform of the non-insulated DC/DC converter 1, the on-time (the time during which a voltage is applied) of the low-side power MOS QL1 is longer than the on-time of the high-side power MOS QH1, and the loss due to the on-resistance of the low-side power MOS QL1 appears to be larger than the switching loss thereof. Hence the channel width per unit area can be made larger by using a field-effect transistor whose channel is formed in the thickness direction of the semiconductor chip than by using a field-effect transistor whose channel is formed along the principal surface of the semiconductor chip. Namely, the low-side power MOS QL1 made of a field-effect transistor whose channel is formed in the thickness direction of the semiconductor chip can reduce the on-resistance, so that, even if the current flowing through the non-insulated DC/DC converter 1 increases, the voltage conversion efficiency of the converter 1 can be improved. In FIG. 3, "Ton" represents an on-time pulse width of the high-side power MOS QH1, and "T" represents a pulse period. The low-side power MOS QL1 is formed on a semiconductor chip 4PL provided separately from the semiconductor chips 4C and 4 PH.

The input capacitor Cin serves as a power supply which temporarily accumulates energy (charges) supplied by the input power supply VIN and supplies the non-insulated DC/DC converter 1 with the accumulated energy. It is connected in parallel with the input power supply VIN.

In the non-insulated DC/DC converter 1, the wiring connecting the source of the power MOS QH1 and the drain of the power MOS QL1 is provided with the output node N for supplying an output power supply potential to the outside. The output node N is electrically connected to the coil L via output wiring. It is further connected electrically to the load LD via the output wiring. A Schottky barrier diode (hereinafter referred to as the "SBD") may be electrically connected to be parallel with the power MOS QL1 between the output wiring connecting the output node N and the coil L and the terminal for supplying the reference potential GND. The SBD is a diode whose forward voltage Vf is lower than that of the parasitic diode Dp2 of the power MOS QL1. The anode of the SBD is electrically connected to the terminal for supplying the reference potential GND. The cathode of the SBD is electrically connected to the output wiring connecting the output node N and the drain of the power MOS QL1. With the SBD connected as described above, the voltage drop during dead time subsequent to turning off of the power MOS QL1 can be reduced, so that the conduction loss of the diode can be reduced. In addition, the diode recovery loss can also be reduced by shortening the reverse-recovery time (trr).

The output capacitor Cout is electrically connected between the output wiring connecting the coil L and the load LD and the terminal for providing the reference potential GND. Symbols "Iout" and "Vout" represent an output current and an output voltage, respectively.

The non-insulated DC/DC converter 1 performs supply voltage conversion by turning on and off the power MOSs QH1 and QL1 alternately and synchronously. Namely, when the high-side power MOS QH1 is on, a current (a first current) I1 from the terminal ET1 flows through the output node N via the power MOS QH1. When the high-side power MOS QH1 is off, the counter voltage of the coil L causes a current I2 to flow. By turning on the low-side power MOS QL1 while the current I2 is flowing, the voltage drop can be reduced.

Figure 4:
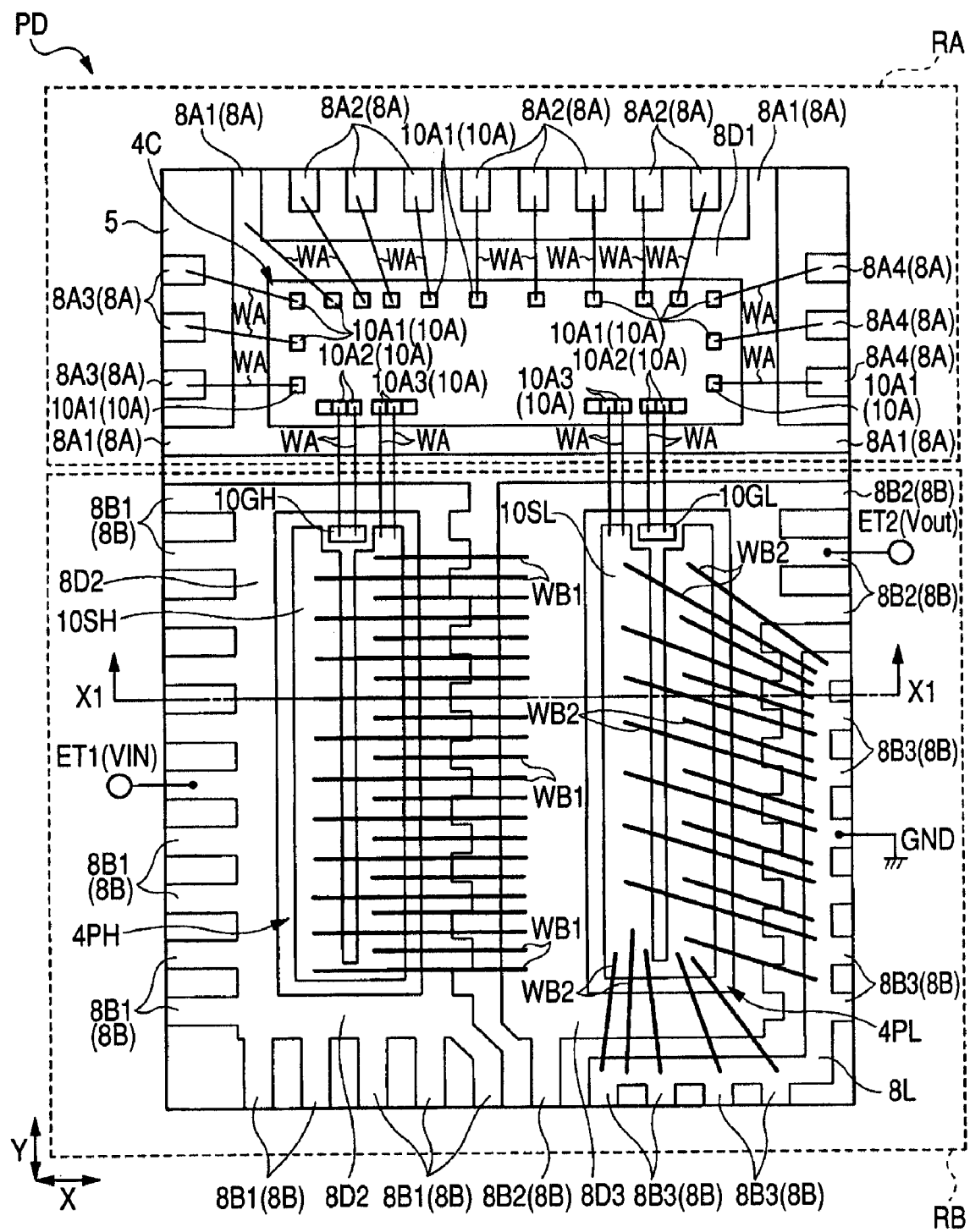
FIG. 4 is an overall plan view of the top side of the semiconductor device making up the POL power supply shown in FIG. 2.
Figure 5:
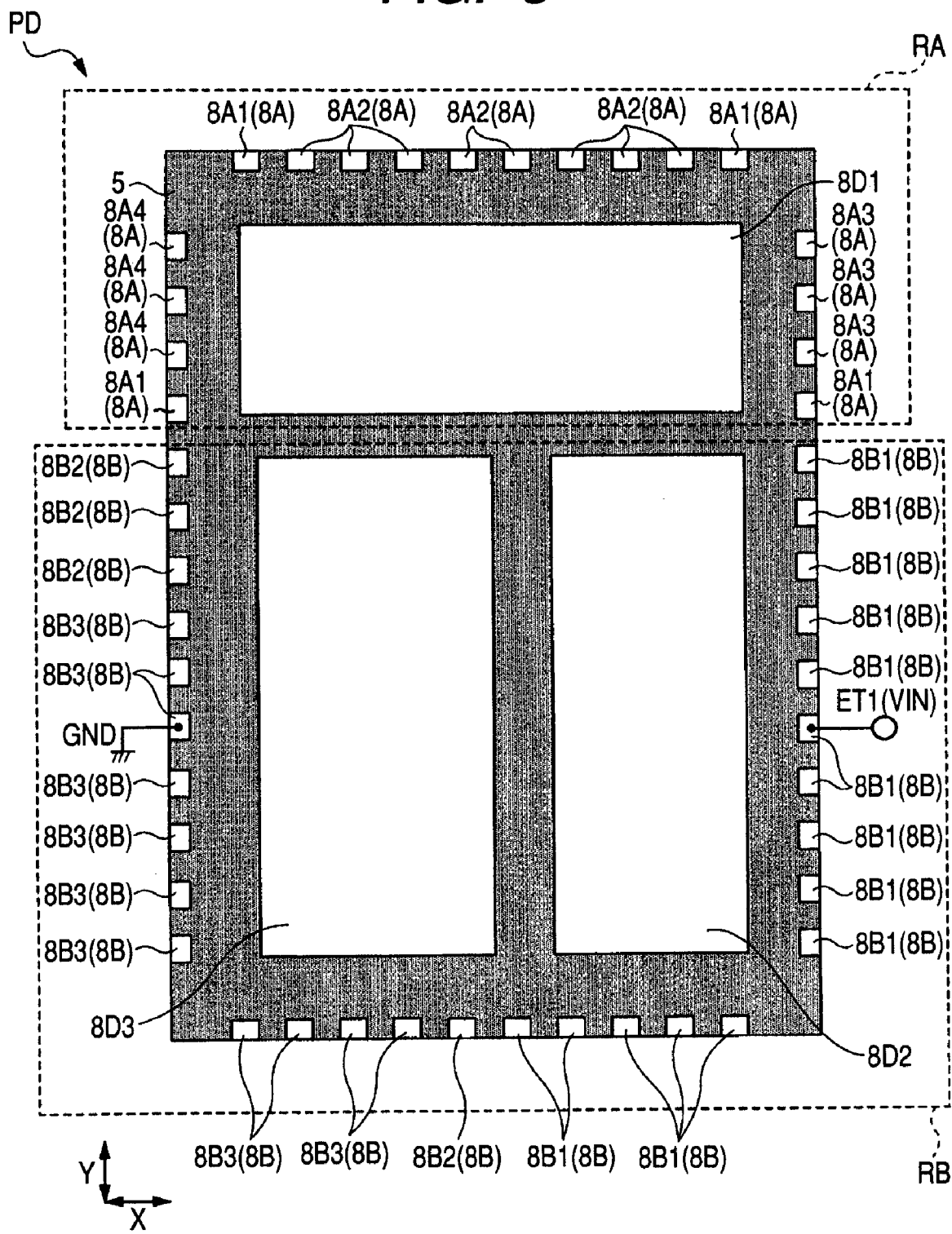
FIG. 5 is an overall plan view of the bottom side of the semiconductor device shown in FIG. 4.
Figure 6:
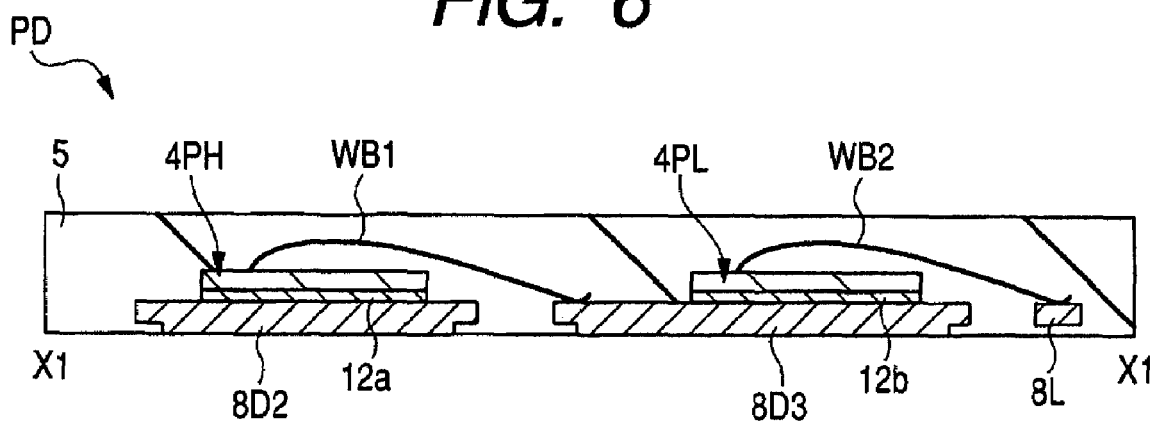
FIG. 6 is a cross-sectional view taken along line X1-X1 in FIG. 4.
Figure 7:
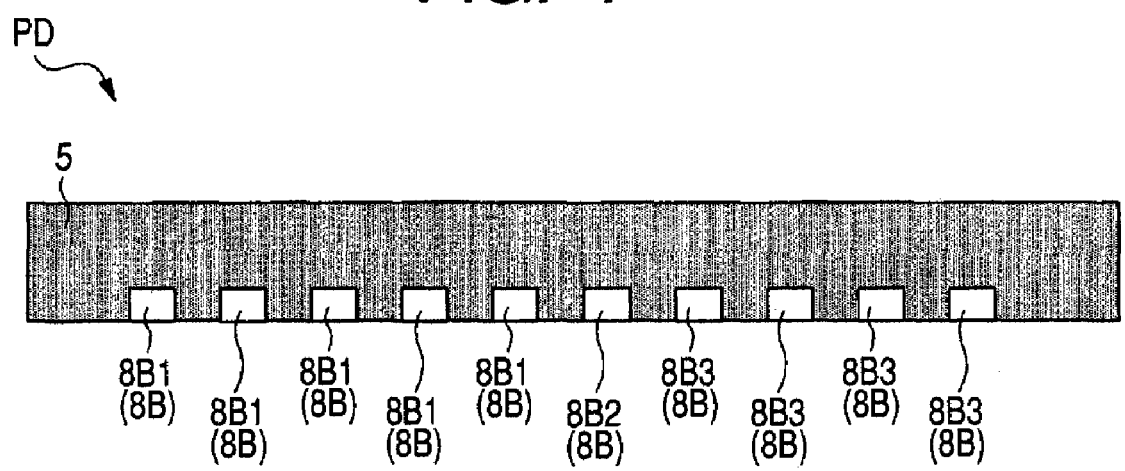
FIG. 7 is a side view of the semiconductor device shown in FIG. 4.

FIG. 4 is an overall plan view of the top side of the semiconductor device PD of the non-insulated DC/DC converter 1. FIG. 5 is an overall plan view of the bottom side of the semiconductor device PD shown in FIG. 4. FIG. 6 is a cross-sectional view taken along line X1-X1 in FIG. 4. FIG. 7 is a side view of the semiconductor device PD shown in FIG. 4. In FIG. 4, for convenience of explanation, the package 5 is shown as being transparent, giving a view of the package interior. In FIG. 5, the surface of the package 5 is shaded for better viewability. Symbols "X" and "Y" represent a first direction and a second direction, respectively, the second direction being perpendicular to the first direction X.

The semiconductor device PD according to the first embodiment has a surface-mounted package (sealing body) 5 of, for example, a QFN (Quad Flat Non-leaded package) structure. Namely, the package 5 is shaped like a thin plate bounded by a quadrilateral principal surface (a first principal surface), a back surface (a second principal surface), and four side surfaces each in a plane intersecting the principal surface and the back surface, the principal surface and the back surface being on opposite sides across the thickness of the package. The principal surface and the back surface of the package 5 each have two first sides extending in the first direction X and two second sides extending in the second direction Y that is perpendicular to the first direction X. Along the four sides of the package 5, there are plural leads (first external terminals) 8A (8A1, 8A2, 8A3, and 8A4) and plural leads (second external terminals) 8B (8B1, 8B2, and 8B3) which are exposed on the side surfaces and an outer peripheral portion of the back surface of the package 5. In the present example, the leads 8A and 8B are formed without greatly protruding outwardly from the package 5.

The package 5, however, is not limited to a QFN structure. Its structure can be modified in various ways. It may have, for example, a different flat package structure such as a QFP (Quad Flat Package) structure or an SOP (Small Out-line Package) structure. When a QFP structure is used, the plural leads 8A and 8B are exposed in a state greatly protruding outwardly from the four sides (from the side surfaces and the outer peripheral portion of the back surface) of the package 5. When an SOP structure is used, the plural leads 8A and 8B are exposed in a state greatly protruding outwardly from two sides (from side surfaces and the outer peripheral portion of the back surface) of the package 5.

The package 5 may be made of, for example, epoxy resin. To achieve stress reduction, for example, the package 5 may also be made of biphenyl-based thermosetting resin with additives such as a phenol hardener, a silicone rubber and a filler.

Portions of three die pads (where tabs and chips are mounted) 8D1, 8D2, and 8D3, the semiconductor chips 4C, 4PH, and 4PL mounted on the principal surfaces (first principal surfaces) of the die pads 8D1 to 8D3, respectively, wires WA1, WA2, and WB, portions of the plural leads 8A and 8B, and a lead wire 8L are sealed in the package 5.

The die pads 8D1 to 8D3 are adjacently arranged with a prescribed spacing between them. In the present example, the die pad 8D1 is disposed such that its longitudinal direction (the first direction X) coincides with the direction in which the first sides (the sides in the first direction X) of the package 5 extend. The die pads 8D2 and 8D3 are disposed such that their longitudinal direction (the second direction Y) coincides with the direction in which the second sides (the sides in the second direction Y) of the package 5 extend. The two die pads 8D2 and 8D3 are arranged side by side along the longitudinal direction of the die pad 8D1.

The die pads 8D1 to 8D3, the leads 8A and 8B, and the lead wire 8L are members included in wiring substrates (first and second wiring substrates). They are formed mainly of metal, for example, 42 alloy. The die pads 8D1 to 8D3 and the leads 8A and 8B may also be formed of a different material, for example, cupper (Cu), or cupper which is plated with nickel (Ni), palladium (Pd), and gold (Au) in the mentioned order from its surface upward.

Portions of the back surfaces (second principal surfaces) of the die pads 8D1 to 8D3 are exposed on the back side of the package 5. The heat generated by the semiconductor chips 4C, 4PH, and 4PL during operation is radiated to outside the package 5 mainly from the back surfaces (second principal surfaces) of the semiconductor chips 4C, 4PH, and 4PL via the die pads 8D1 to 8D3. With this taken into account, the die pads 8D1 to 8D3 are formed to be larger in area than the semiconductor chips 4C, 4PH, and 4PL, respectively, so that radiation performance of the package 5 is enhanced.

Portions of the back surfaces of the die pads 8D1 to 8D3 and leads 8A and 8B are half-etched to reduce their thickness. As a result, the encapsulant used to form the package 5 is caused to cover thin portions of the die pads 8D1 to 8D3 and leads 8A and 8B on the back surfaces, enhancing adhesion between the die pads 8D1 to 8D3 and leads 8A and 8B, and the encapsulant of the package 5. This reduces or prevents breaking away or deformation of the die pads 8D1 to 8D3 and leads 8A and 8B.

The die pad 8D1 has a plane rectangular shape with its length in the first direction X larger than its length in the second direction Y. The plural leads 8A1 are integrally connected to four corner portions of the die pad 8D1. The plural leads 8A2 are arranged along a long side of the die pad 8D1. The plural leads 8A3 and 8A4 are arranged along the short sides, i.e. along the longitudinal ends of the die pad 8D1.

On the principal surface (a first principal surface) of the die pad 8D1, the semiconductor chip 4C for the control circuit is mounted with its principal surface (a first principal surface) facing up and back surface (a second principal surface) facing the die pad 8D1. The electrode on the back surface of the semiconductor chip 4C is joined and electrically connected to the die pad 8D1 via a conductive adhesion layer.

The semiconductor chip 4C has a plane rectangular shape with its length in the first direction X larger than its length in the second direction Y. Plural bonding pads (hereinafter referred to simply as "pads") 10A (10A1, 10A2, and 10A3) are arranged in the vicinity of the outer periphery of the principal surface of the semiconductor chip 4C. The pads 10A are arranged to be symmetrical about the longitudinal center of the semiconductor chip 4C. Of the pads 1A, the plural pads 10A1 are electrically connected to the leads 8A via plural bonding wires (hereinafter referred to simply as "wires") The plural pads 10A2 are electrically connected to pads 10GH and 10GL, being described later, for the gate electrodes of the semiconductor chips 4PH and 4PL via plural wires WA. The plural pads 10A3 are electrically connected to pads 10SH and 10SL, being described later, for the source electrodes of the semiconductor chips 4PH and 4PL via plural wires WA. The wires WA are formed of, for example, gold (Au).

Figure 8:
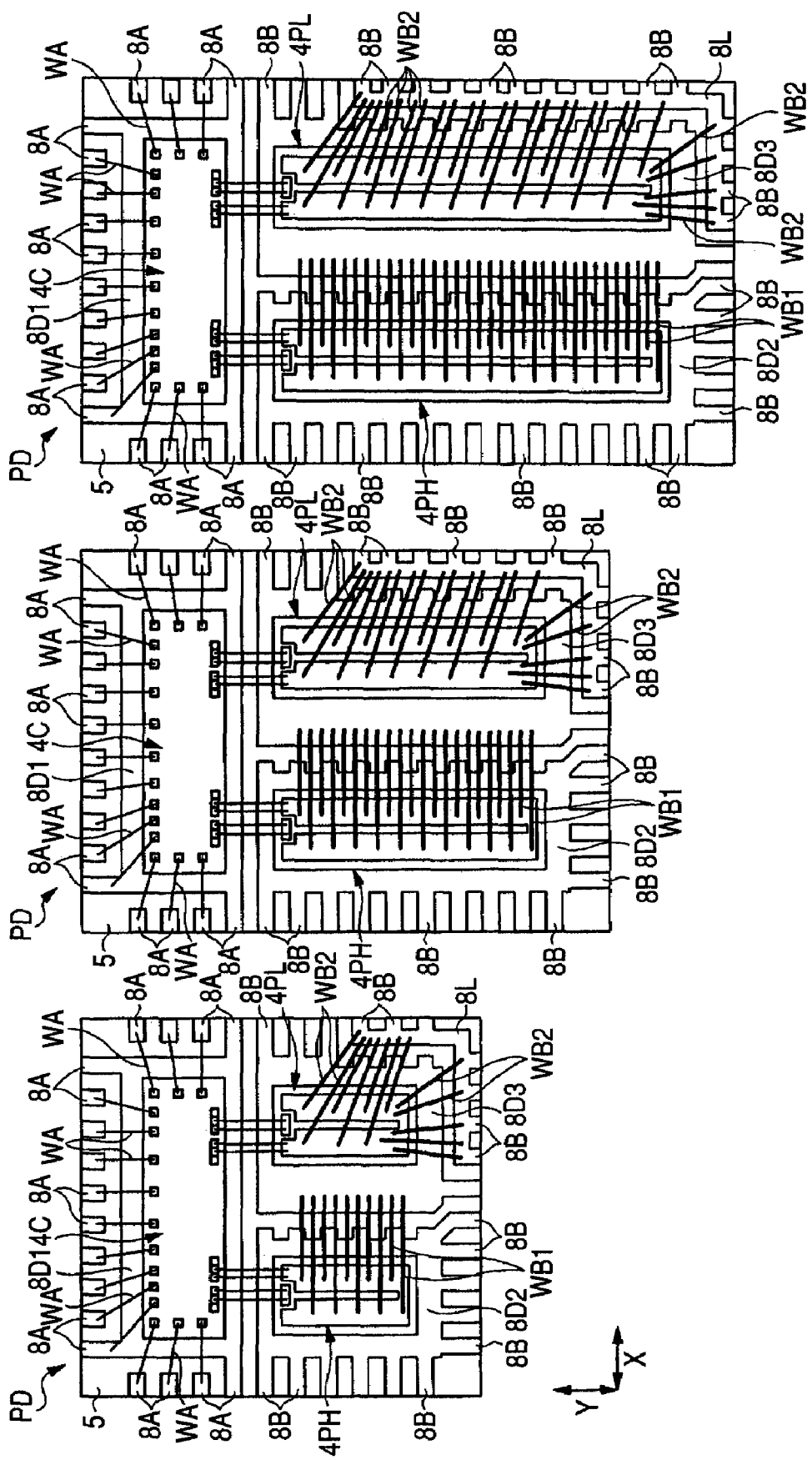
FIGS. 8(a) to 8(c) are plan views showing an example lineup of semiconductor devices based on the one shown in FIG. 4.

In the first embodiment, the design conditions applied to the plural leads 8A, the die pad 8D1, the semiconductor chip 4C, and the wires WA (or applied to at least the plural leads 8A) located in the area inside a broken-line box RA in FIG. 4 are common (identical) between plural semiconductor devices ((a) to (c)) shown in FIGS. 8(a) to 8(c). Namely, the design conditions applied to the plural leads 8A, the die pad 8D1, the semiconductor chip 4C, and the wires WA remain unchanged (fixed). The design conditions include physical factors such as the arrangement, dimensions, materials, and numbers of the leads 8A, die pad 8D1, semiconductor chip 4C, and wires WA, and electrical factors concerning signals and power supplies.

The die pad 8D2 shown in FIG. 4 has a plane rectangular shape with its length in the direction along the second sides (the second direction Y) of the package 5 larger than its length in the direction along the first sides (the first direction X) of the package 5. The plural leads 8B1 (8B) are integrally connected to and arranged along two sides of the die pad 8D2, the two sides extending in mutually intersecting directions, respectively. The high-potential input power supply VIN is supplied to the plural leads 8B1.

On the principal surface (a first principal surface) of the die pad 8D2, the semiconductor chip 4PH for the power transistor is mounted with its principal surface (a first principal surface) facing up and back surface (a second principal surface) facing the die pad 8D2. The electrode (drain electrode) on the back surface of the semiconductor chip 4PH is joined and electrically connected to the die pad 8D2 via a conductive adhesion layer 12a. The electrode on the back surface of the semiconductor chip 4PH is electrically connected to the drain D of the high-side power MOS QH1.

The semiconductor chip 4PH shown in FIG. 4 has a plane rectangular shape with its length in the longitudinal direction of the die pad 8D2 (namely, in the direction along the second sides of the package 5, i.e., the second direction Y) larger than its length in the short side direction (namely, in the direction along the first sides of the package 5, i.e. the first direction X). The pads 10GH and 10SH for the gate electrode and the source electrode, respectively, are disposed on the principal surface (the first principal surface) of the semiconductor chip 4PH.

The pad 10GH for the gate electrode is electrically connected to the gate electrode of the high-side power MOS QH1. The pad 10GH for the gate electrode is disposed in a longitudinal end portion of the semiconductor chip 4PH. The semiconductor chip 4PH is disposed such that, with the pad 10GH for the gate electrode facing the semiconductor chip 4C for the control circuit, the longitudinal direction of the semiconductor chip 4PH (the second direction Y) intersects (is perpendicular to) the longitudinal direction of the semiconductor chip 4C (the first direction X).

The pad 10SH for the source electrode is larger than the pad 10GH for the gate electrode. The pad 10SH for the source electrode is electrically connected to the source S of the high-side power MOS QH1. It is also electrically connected to the die pad 8D3 via wires WB1. The wires WB1 are made of the same material as the wires WA, but they are thicker than the wires WA.

The die pad 8D3 shown in FIG. 4 has a plane rectangular shape with its length along the second sides of the package 5 (the second direction Y) larger than its length along the first sides of the package 5 (the first direction X). The plural leads 8B2 (8B) are integrally connected to portions in the vicinity of two corners of the die pad 8D3, the two corners being diagonal to each other. The plural leads 8B2 make up an output terminal ET2 of the semiconductor device PD.

On the principal surface (a first principal surface) of the die pad 8D3, the semiconductor chip 4PL for the power transistor is mounted with its principal surface (a first principal surface) facing up and back surface (a second principal surface) facing the die pad 8D3. The electrode (drain electrode) on the back surface of the semiconductor chip 4PL is joined and electrically connected to the die pad 8D3 via a conductive adhesion layer 12b. The electrode on the back surface of the semiconductor chip 4PL is electrically connected to the drain D of the low-side power MOS QL1.

The semiconductor chip 4PL shown in FIG. 4 has a plane rectangular shape with its length in the longitudinal direction of the die pad 8D3 (namely, in the direction along the second sides of the package 5, i.e., the second direction Y) larger than its length in the short-side direction (namely, in the direction along the first sides of the package 5, i.e. the first direction X). The pads 10GL and 10SL for the gate electrode and the source electrode, respectively, are disposed on the principal surface (the first principal surface) of the semiconductor chip 4PL.

The pad 10GL for the gate electrode is electrically connected to the gate electrode of the low-side power MOS QL1. The pad 10GL for the gate electrode is disposed in a longitudinal end portion of the semiconductor chip 4PL. The semiconductor chip 4PL is disposed such that, with the pad 10GL for the gate electrode facing the semiconductor chip 4C for the control circuit, the longitudinal direction of the semiconductor chip 4PL (the second direction Y) intersects (is perpendicular to) the longitudinal direction of the semiconductor chip 4C (the first direction X). Namely, the two semiconductor chips 4PH and 4PL for the power transistors are disposed side by side along the longitudinal direction (the first direction X) of the semiconductor chip 4C for the control circuit.

The pad 10SL for the source electrode of the semiconductor chip 4PL is larger than the pad 10GL for the gate electrode. The pad 10SL for the source electrode is electrically connected to the source S of the low-side power MOS QL1. It is also electrically connected to the lead wire 8L via wires WB2. The wires WB2 are made of the same material as the wires WA, but they are thicker than the wires WA.

The lead wire 8L is disposed in the vicinity of two sides of the die pad 8D3, the two sides extending in mutually intersecting directions, respectively. It extends along the two sides such that it is adjacent to the two sides while being spaced from them by a prescribed distance. The plural leads 8B3 (8B) are arranged along and integrally connected to the lead wire 8L. The reference potential GND is supplied to the leads 8B3.

In the first embodiment, the design conditions applied to the plural leads 8B, the die pads 8D2 and 8D3, the semiconductor chips 4PH and 4PL, and the wires WB1 and WB2 (or applied to at least the plural leads 8b) located in the area inside a broken-line box RB in FIG. 4 may differ between plural semiconductor devices PD. Namely, the design conditions applied to the plural leads 8B, the die pads 8D2 and 8D3, the semiconductor chips 4PH and 4PL, and the wires WB1 and WB2 may be changed according to the load LD to be connected. The design conditions include physical factors such as the arrangement, dimensions, materials, and numbers of the leads 8B, the die pads 8D2 and 8D3, the semiconductor chips 4PH and 4PL, and the wires WB1 and WB2, and electrical factors concerning signals and power supplies. Particularly, the numbers of the leads 8B, and the lengths of the die pads 8D2 and 8D3 and semiconductor chips 4PH and 4PL in the second direction Y (direction intersecting the longitudinal direction of the die pad 8D1 as well as the semiconductor chip 4C) are more likely to be changed than others.

As shown in FIG. 1, a variety of loads LD are connected to the POL power supplies P4. The POL power supplies P4 are therefore required to meet different requirements for different types of the loads LD, for example, as to the output voltage, output current, and switching frequency. Hence, it is necessary to prepare a lineup of semiconductor devices PD comprising POL power supplies P4 corresponding to plural loads LD.

When, in preparing such a lineup of semiconductor devices PD, the arrangement of the power transistor circuits and control circuit is made different between different semiconductor devices, the arrangement of leads (external terminals) also require to be made different between the different semiconductor devices. The semiconductor devices are each mounted on a wiring substrate and then installed in an electronic device such as a power supply system. The wiring pattern on a wiring substrate is required to correspond to the lead arrangement in the semiconductor device to be mounted on the wiring substrate. Depending on the layout of the wiring pattern on the wiring substrate, the control circuit in the semiconductor device is possibly caused to malfunction.

According to the first embodiment, semiconductor devices PD compatible with various types of loads LD are made available by changing the design conditions applied to the plural leads 8B, the die pads 8D2 and 8D3, the semiconductor chips 4PH and 4PL, and the wires WB1 and WB2 (or applied to at least the plural leads 8b) without changing the design conditions applied to the plural leads 8A, the die pad 8D1, the semiconductor chip 4C, and the wires WA (or applied to at least the plural leads 8A). Namely, whereas the PWM circuit in the semiconductor chip 4C of the semiconductor device PD may malfunction relatively easily, the layout of the leads 8A electrically connected to the PWM circuit is not changed. Therefore, the layout of wiring on the wiring substrate on which the semiconductor device PD is to be mounted can also be left unchanged. This can reduce or prevent malfunction of the PWM circuit in the semiconductor chip 4C of the semiconductor device PD. It is therefore possible to provide a semiconductor device which allows a wiring pattern to be designed with ease for a wiring substrate on which the semiconductor device is to be mounted. Also, the number of times of revising the wiring layout for a wiring substrate on which plural semiconductor devices PD are to be mounted can be decreased, so that the period required to develop an electronic device including a wiring substrate on which plural semiconductor devices PD are mounted can be shortened.

FIGS. 8(a) to 8(c) show an example lineup of semiconductor devices PD as described above. In each of FIGS. 8(a) to 8(c), for convenience of explanation, the package 5 is shown as being transparent, giving a view of the package interior.

FIGS. 8(a) to 8(c) show semiconductor devices PD to provide output currents of 10 A, 16 A, and 20 A, respectively. Even though the three semiconductor devices differ in the amount of output current, they use the same fixed layout of the leads 8A to which the semiconductor chip 4C for the control circuit is electrically connected. Furthermore, the lengths of their first sides in the first direction X of the package 5 are the same.

The three semiconductor devices PD differ, for example, in the layout (number) of the leads 8B, to which the semiconductor chips 4PH and 4PL for the power transistors are electrically connected, according to the required amounts of output current (current capacities required for the loads LD). The lengths in the second direction Y (the direction along the second sides of the package 5) of the die pads 8D2 and 8D3 and the semiconductor chips 4PH and 4PL are larger in the semiconductor devices PD for larger amounts of output current. Namely, for a larger output current, each of the power MOSs QH1 and QL1 has a greater gate width and a larger number of leads 8B. Therefore, among the three semiconductor devices PD, one for a larger output current has longer second sides extending in the second direction Y of the package 5. Suppose a semiconductor device for an output current of 20 A is developed by changing the design of a semiconductor device for an output current of 10 A. Conventionally, in such a case, the PWM circuit of the semiconductor device for an output current of 20 A may malfunction. According to the first embodiment, however, such design modification can be made by changing, according to the output current requirement, the layout and numbers of the leads 8B to which the semiconductor chips 4PH and 4PL for the power transistors are electrically connected without changing the layout and numbers of the leads 8A to which the semiconductor chip 4C for the control circuit is electrically connected. In this way, the probability of malfunction of the PWM circuit can be reduced.

Figure 9:
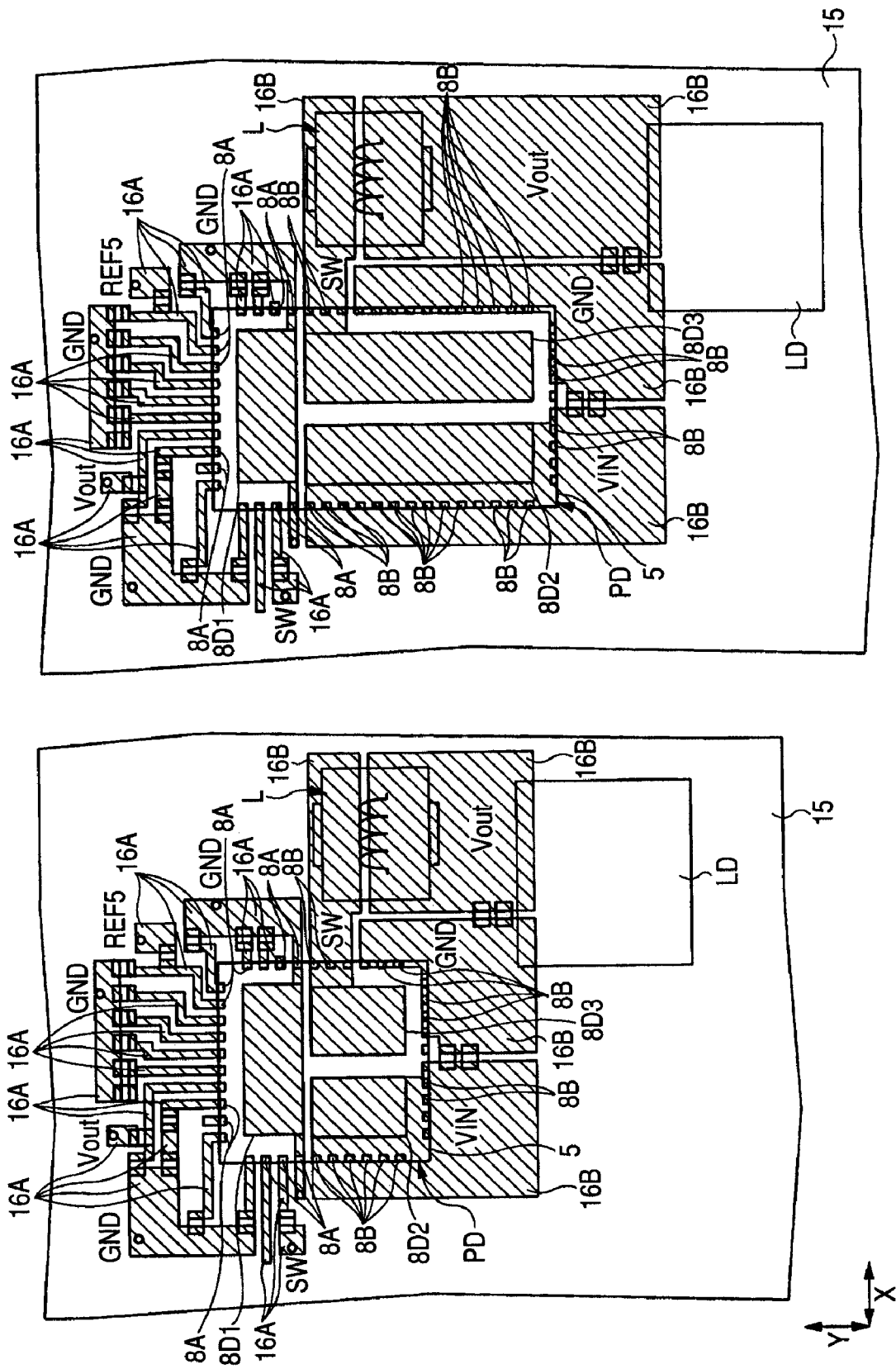
FIG. 9 is a plan view of essential parts of an electronic device including plural semiconductor devices to provide different amounts of output current.
Figure 10:
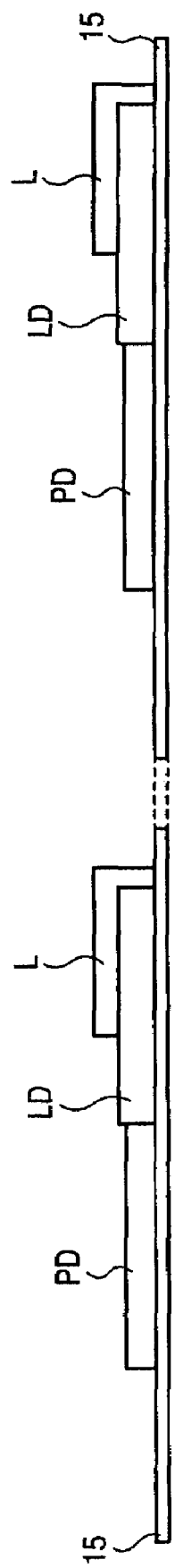
FIG. 10 is a side view showing the electronic device shown in FIG. 9 as seen from the bottom side of FIG. 9.

FIG. 9 is a plan view of essential parts of an electronic device having plural semiconductor devices PD for different amounts of output current. FIG. 10 is a side view showing the electronic device shown in FIG. 9 as seen from the bottom side of FIG. 9. In FIG. 10, the principal surface of an underlayer wiring substrate 15 of the electronic device is regarded as transparent for convenience of explanation.

The electronic device shown in FIGS. 9 and 10 has two semiconductor devices PD for different amounts of output current mounted on a same principal surface of the wiring substrate 15 of the electronic device. Of the two semiconductor devices PD shown in FIGS. 9 and 10, the one on the left is for an output current of, for example, about 10 A, and the one on the right is for an output current of, for example, about 20 A. A load LD and a coil L are mounted in the vicinity of each of the semiconductor devices PD mounted on the same principal surface of the wiring substrate 15. The load LD may be a memory circuit such as a DRAM (Dynamic RAM) or a flash memory, or a logic circuit such as a CPU or an FPGA (Field Programmable Gate Array).

Even though the plural semiconductor devices PD differ in the amount of output current, they are identical as to the layout and numbers of the leads 8A for the control circuit. Therefore, the layout of wiring (wiring in a broad sense including wiring and electrodes (lands)) 16A to which the leads 8A of the corresponding one of the semiconductor devices PD are electrically connected is the same (fixed in a common layout) between the areas on the wiring substrate 15 where the semiconductor devices PD are mounted, respectively.

The layout and numbers of the leads 8B for the power transistor, however, differ between the plural semiconductor devices PD for different amounts of output current. Therefore, the layout of wiring (wiring in a broad sense including wiring and electrodes (lands)) 16B to which the leads 8B of the corresponding one of the semiconductor devices PD are electrically connected also differs between the plural semiconductor devices PD. Of the two semiconductor devices PD shown in FIG. 9, the one on the right for a larger output current is greater in the dimension of the wiring 16B in the second direction Y (the direction along the second sides of the package 5, the direction intersecting (being perpendicular to) the longitudinal direction of the die pad 8D1) than the one on the left for a smaller output current.

According to the first embodiment, in the plural semiconductor devices PD, the layout and numbers of the leads 8B to which the semiconductor chips 4PH and 4PL for the power transistors are electrically connected are changed according to the amounts of output current the semiconductor chips 4PH and 4PL are required to provide, respectively, whereas the layout and numbers of the leads 8A to which the semiconductor chip 4C for the control circuit is electrically connected is left unchanged. In this way, the probability of malfunction of the PWM circuit of each of the plural semiconductor devices PD can be reduced, so that designing of the semiconductor devices PD can be facilitated. Since laying out of the wiring substrate 15 is also made easier, the number of times of modifying the wiring substrate 15 can be decreased. This eventually allows the period required to develop an electronic device which includes the plural semiconductor devices PD meeting different electrical requirements, for example, as to output current, output voltage, and switching frequency to be shortened. Also, since the number of times of modifying the wiring substrate 15 can be decreased, the electronic device production cost can be reduced.

The structures of the semiconductor chips 4PH and 4PL including the power MOSs QH1 and QL1, respectively, will be described in the following. The semiconductor chips 4PH and 4PL on which the power MOSs QH1 and QL1 are formed, respectively, have an identical structure. In the following, therefore, the structure of only the semiconductor chip 4PH on which the high-side power MOS QH1 is formed will be described. Description of the structure of the semiconductor chip 4PL on which the low-side power MOS QL1 is formed is omitted.

Figure 11:
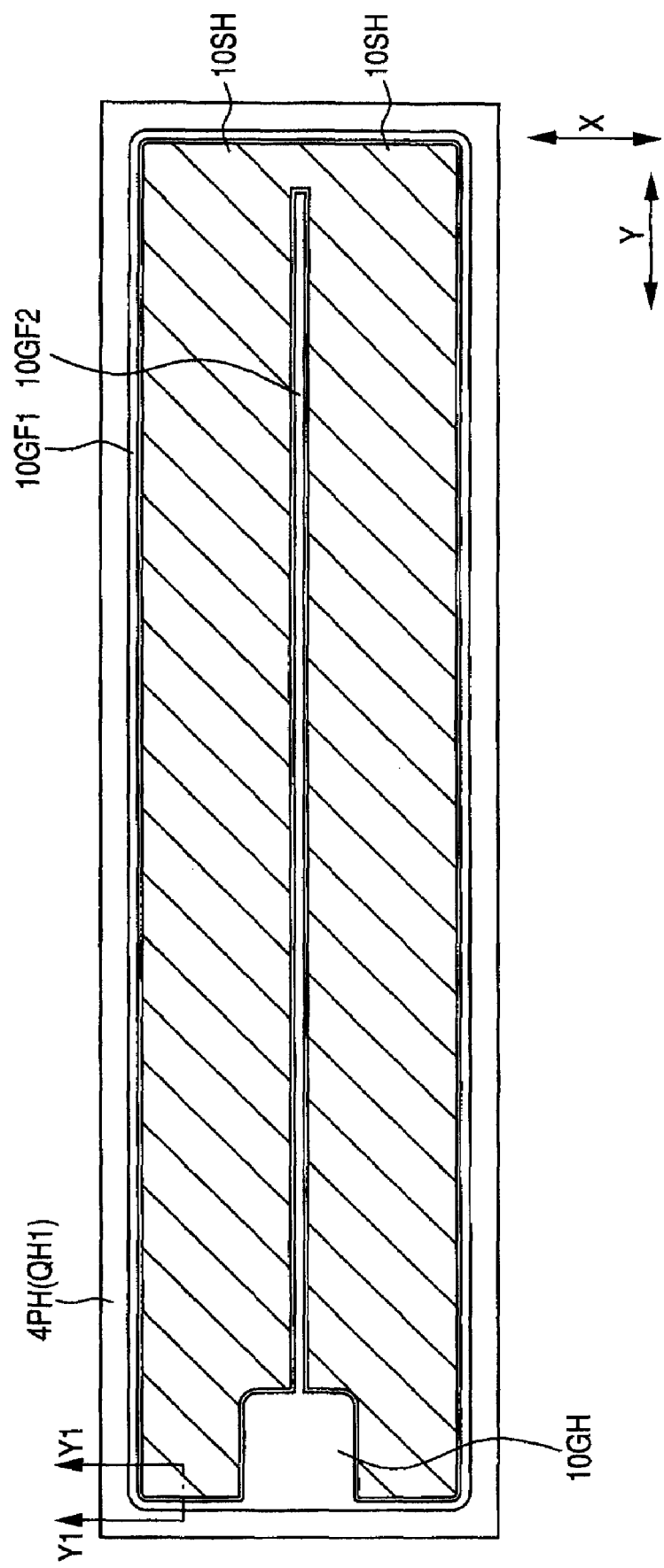
FIG. 11 is an overall plan view of the principal surface of a semiconductor chip on which a high-side power transistor for the semiconductor device shown in FIG. 4 is formed.
Figure 12:
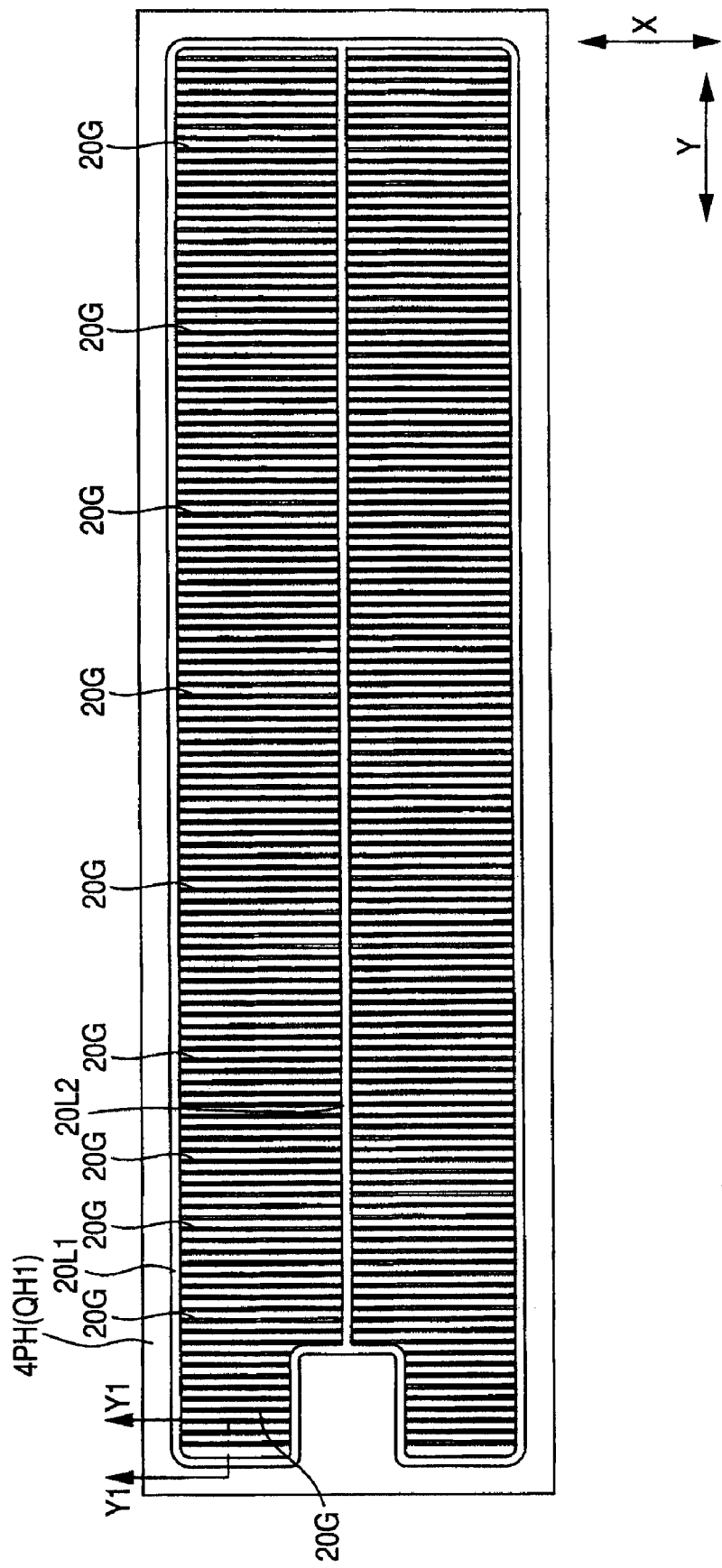
FIG. 12 is an overall plan view of the principal surface of the semiconductor chip, showing a wiring layer under the layer shown in FIG. 11.
Figure 13:
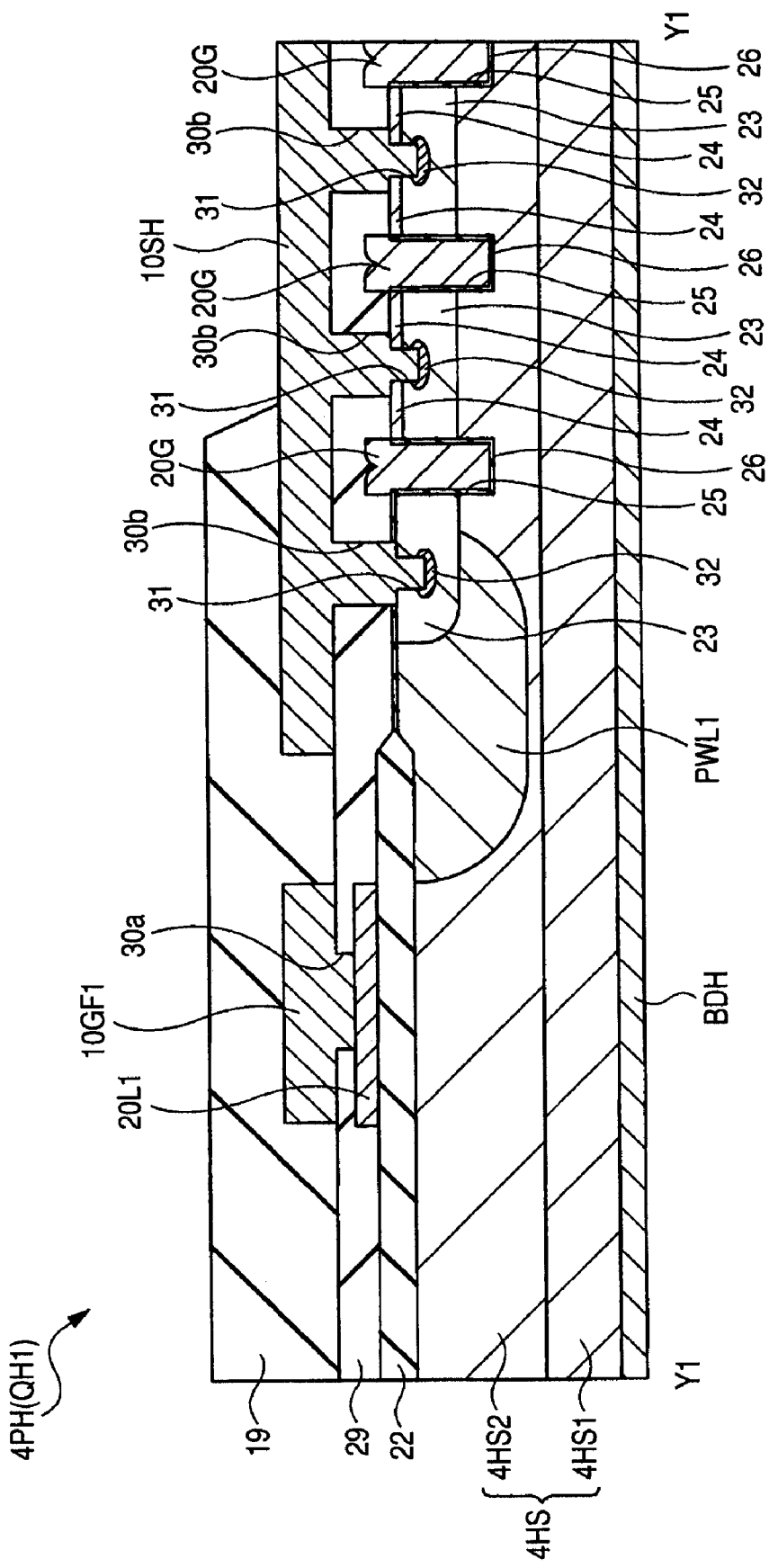
FIG. 13 is a cross-sectional view taken along line Y1-Y1 in FIGS. 11 and 12.
Figure 14:
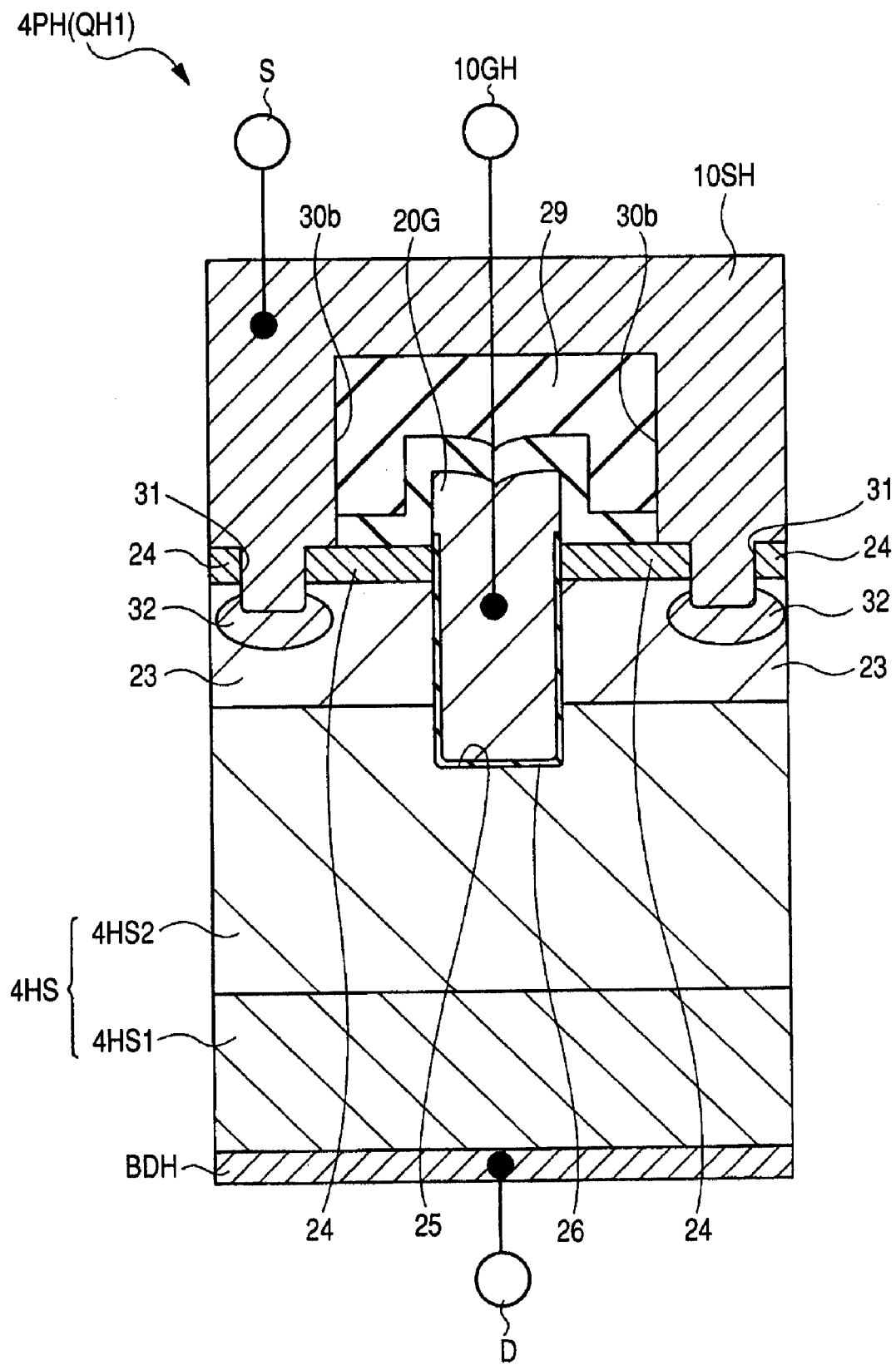
FIG. 14 is an enlarged cross-sectional view of a unit transistor cell of the high-side power transistor on the semiconductor chip shown in FIG. 11.

FIG. 11 is an overall plan view of the principal surface of the semiconductor chip 4PH on which the high-side power MOS QH1 is formed. FIG. 12 is an overall plan view of the principal surface of the semiconductor chip 4PH, showing a wiring layer under the layer shown in FIG. 11. FIG. 13 is a cross-sectional view taken along line Y1-Y1 in FIGS. 11 and 12. FIG. 14 is an enlarged cross-sectional view of a unit transistor cell of the high-side power MOS QH1.

The semiconductor chip 4PH has, for example, a rectangular planar shape with its length in the second direction Y being larger than its length in the first direction X. It has a principal surface (device forming surface: the first principal surface) where elements are formed and a back surface (back electrode forming surface: the second principal surface) located opposite to the principal surface across the thickness the semiconductor chip 4PH.

On the principal surface of the semiconductor chip 4PH, the pad 10GH for the gate electrode of the power MOS QH1, gate fingers (gate wiring patterns) 10GF1 and 10GF2, and the pad 10SH for the source electrode of the power MOS QH1 are disposed. The pads 10GH and 10SH, and the gate fingers 10GF1 and 10GF2 are formed of the same material (for example, aluminum) as the wiring material used on the top layer of the semiconductor chip 4PH.

The pad 10GH for the gate electrode is disposed in the vicinity of a longitudinal end portion (end portion as viewed in the second direction Y) on the principal surface of the semiconductor chip 4PH. The pad 10GH is exposed from an opening formed in a portion of a surface protection film 19 on the top layer of the semiconductor chip 4PH. The surface protection film 19 comprises, for example, a stack of an oxide silicon film and a silicon nitride film (Si3N4) or such a film stack on which an organic film like a polyimide film (PiQ) is further stacked.

The gate fingers 10GF1 and 10GF2 are formed integrally with and electrically connected to the pad 10GH for the gate electrode. The gate finger 10GF1 is formed in the vicinity of the outer periphery of the principal surface of the semiconductor chip 4PH. The gate finger 10GF2 is formed in a middle portion with respect to the short-side direction (the first direction X) of the semiconductor chip 4PH, and extends along the longitudinal direction (the second direction Y) of the semiconductor chip 4PH. One end of the gate finger 10GF2 is connected to the pad 10GH. The other end of the gate finger 10FG2 is spaced from the gate finger 10GF1. The gate fingers 10GF1 and 10GF2 each include a barrier metal layer of, for example, titanium tungsten (TiW) and a metal layer of, for example, aluminum (Al) stacked in order on an underlayer. With these gate fingers provided, the gate resistance of the power MOS QH1 can be reduced, so that the non-insulated DC/DC converter 1 is allowed to handle a larger amount of current at a higher frequency. The surfaces of the gate fingers 10GF1 and 10GF2 are covered with the surface protection film 19.

The pad 10GH for the gate electrode and the gate fingers 10GF1 and 10GF2 are electrically connected to gate wires 20L1 and 20L2, and gate electrodes 20G on the underlayer (shown in FIG. 12). The gate wires 20L1 and 20L2, and the gate electrodes 20G are integrally formed of, for example, low-resistance polycrystal silicon and mutually electrically connected. The gate wire 20L1 is formed in the vicinity of the outer periphery of the principal surface of the semiconductor chip 4PH. The gate wire 20L2 is formed in a middle portion with respect to the short-side direction (the first direction X) of the semiconductor chip 4PH, and extends along the longitudinal direction (the second direction Y) of the semiconductor chip 4PH. The longitudinal ends of the gate wire 20L2 are both connected to the gate wire 20L1.

The gate electrodes 20G are connected between the gate wire 20L2 in the middle portion and the gate wire 20L1 in the vicinity of the outer periphery of the principal surface of the semiconductor chip 4PH. Each of the gate electrodes 20G is a member forming a gate electrode of a unit transistor cell of the high-side power MOS QH1. The total of the lengths in the direction in which the plural gate electrodes 20G extend (the first direction X shown in FIG. 12, i.e. the short-side direction of the semiconductor chip 4PH) of the plural gate electrodes 20G is the gate width of the power MOS QH1. In the example shown in FIG. 12, the gate electrodes 20G shown by shaded hatching are arranged in a striped pattern. Namely, the plural, flat strip-shaped gate electrodes 20G extending in the first direction X are arranged along the second direction Y. The gate electrodes 20G, however, need not necessarily be arranged in a striped pattern. They may be arranged in various ways, for example, in a flat grating pattern.

The pad 10SH for the source electrode is disposed being surrounded by the gate fingers 10GF1 and 10GF2. It is insulated from the pad 10GH for the gate electrode and the gate fingers 10GF1 and 10GF2. The pad 10SH for the source electrode is exposed from the opening formed in a portion of the surface protection film 19 on the top layer of the semiconductor chip 4PH. The upper and lower parts, as seen in FIG. 11, of the pad 10SH are integrally joined and thereby electrically connected where the gate finger 10GF2 in the middle portion with respect to the short-side direction of the semiconductor chip 4PH is terminated.

A semiconductor substrate (hereinafter referred to simply as the "substrate") 4HS includes a semiconductor layer 4HS1 of, for example, n+ type silicon monocrystal and an epitaxial layer 4HS2 of, for example, n– type silicon monocrystal, the epitaxial layer 4HS2 being over the semiconductor layer 4HS1. A field insulating film 22 of, for example, oxide silicon ($SiO_2$) is formed over the principal surface of the epitaxial layer 4HS2. Plural unit transistor cells included in the power MOS QH1 are formed in an active region surrounded by the field insulating film 22 and a p-type well PWL1 under the field insulating film 22. In the power MOS QH1, the plural unit transistor cells are connected in parallel.

The unit transistor cells each comprise an n-channel power MOS having, for example, a trench-gate structure. The trench-gate structure enables the unit transistor cells to be made finer and higher-integrated.

The semiconductor layer 4HS1 and the epitaxial layer 4HS2 have a function as a drain region for the unit transistor cell. A back electrode BDH for the drain electrode is formed on the back surface of the substrate 4HS (semiconductor chip 4PH). The back electrode BDH is made of, for example, gold (Au). It is electrically connected to the die pad 8D2.

P-type semiconductor regions 23 formed in the epitaxial layer 4HS2 function as channel forming regions of the unit transistor cells. n+ type semiconductor regions 24 formed above the p-type semiconductor regions 23 function as source regions of the unit transistor cells.

Grooves 25 are formed on the principal surface of the substrate 4HS, the grooves 25 having a depth extending in the thickness direction of the substrate 4HS. Each of the grooves 25 extends depthwise from the upper surface of an n+ type semiconductor region 24, through the n+ type semiconductor region 24 and a p-type semiconductor region 23, into the epitaxial layer 4HS2 under the p-type semiconductor region 23 to be terminated therein. A gate insulating film 26 of, for example, oxide silicon is formed over the bottom surface and side surface of each of the grooves 25. Each of the grooves 25 holds one of the gate electrodes 20G, the gate insulating film 26 being formed between the groove 25 and the gate electrode 20G. The gate electrodes 20G are, as described above, formed integrally with and electrically connected to the gate wire 20L1. The gate wires 20L1 and 20L2 are electrically connected to the gate fingers 10GF1 and 10GF2 via a contact hole 30a formed in an insulating film 29 covering the gate wires 20L1 and 20L2.

The pad 10SH for the source electrode is electrically connected to the n+ type semiconductor regions 24 for the source via contact holes 30b formed in the insulating film 29. The pad 10SH for the source electrode is electrically connected to a p+ type semiconductor region 32 at the bottom of each of grooves 31 formed in the epitaxial layer 4HS2, thereby being electrically connected to the p-type semiconductor region 23 for channel formation. The grooves 31 each extend from the top surface of an n+ type semiconductor region 24, through the n+ type semiconductor region 24, into the p-type semiconductor region 23 under the n+ type semiconductor region 24 to be terminated therein.

The operating current of each of the unit transistors flows between the epitaxial layer 4HS2 for the drain and the corresponding n+ type semiconductor region 24 along the side surface of the corresponding gate electrode 20G (i.e. the side surface of the corresponding groove 25) in the thickness direction of the substrate 4HS. Namely, a channel is formed in the thickness direction of the semiconductor chip 4PH.

An example of a method of producing the semiconductor device of the first embodiment will be described based on the production process outlined in FIG. 15 and with reference to FIGS. 16 to 21.

Figure 15:
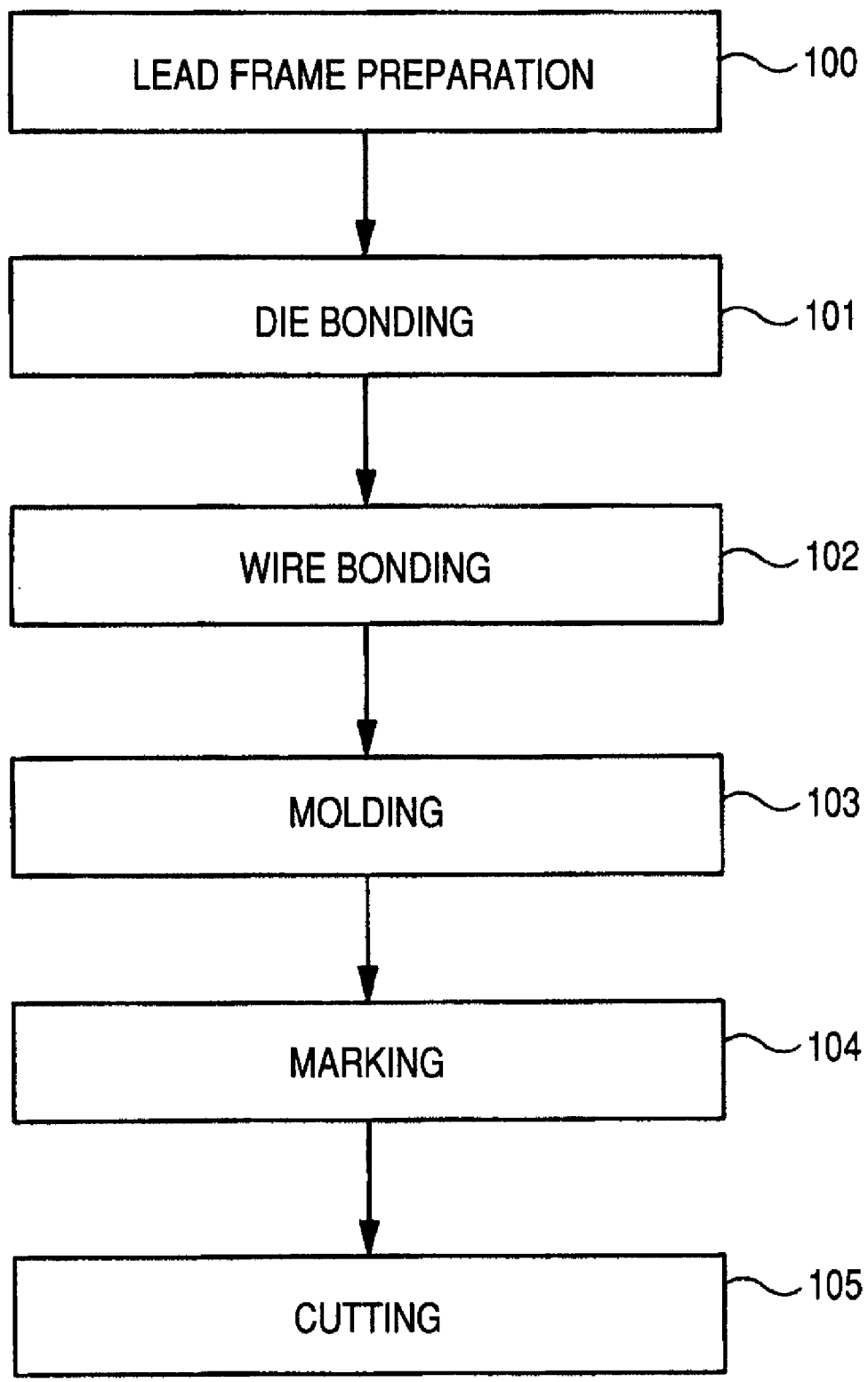
FIG. 15 is a flowchart showing a process for manufacturing the semiconductor device shown in FIG. 4.
Figure 16:
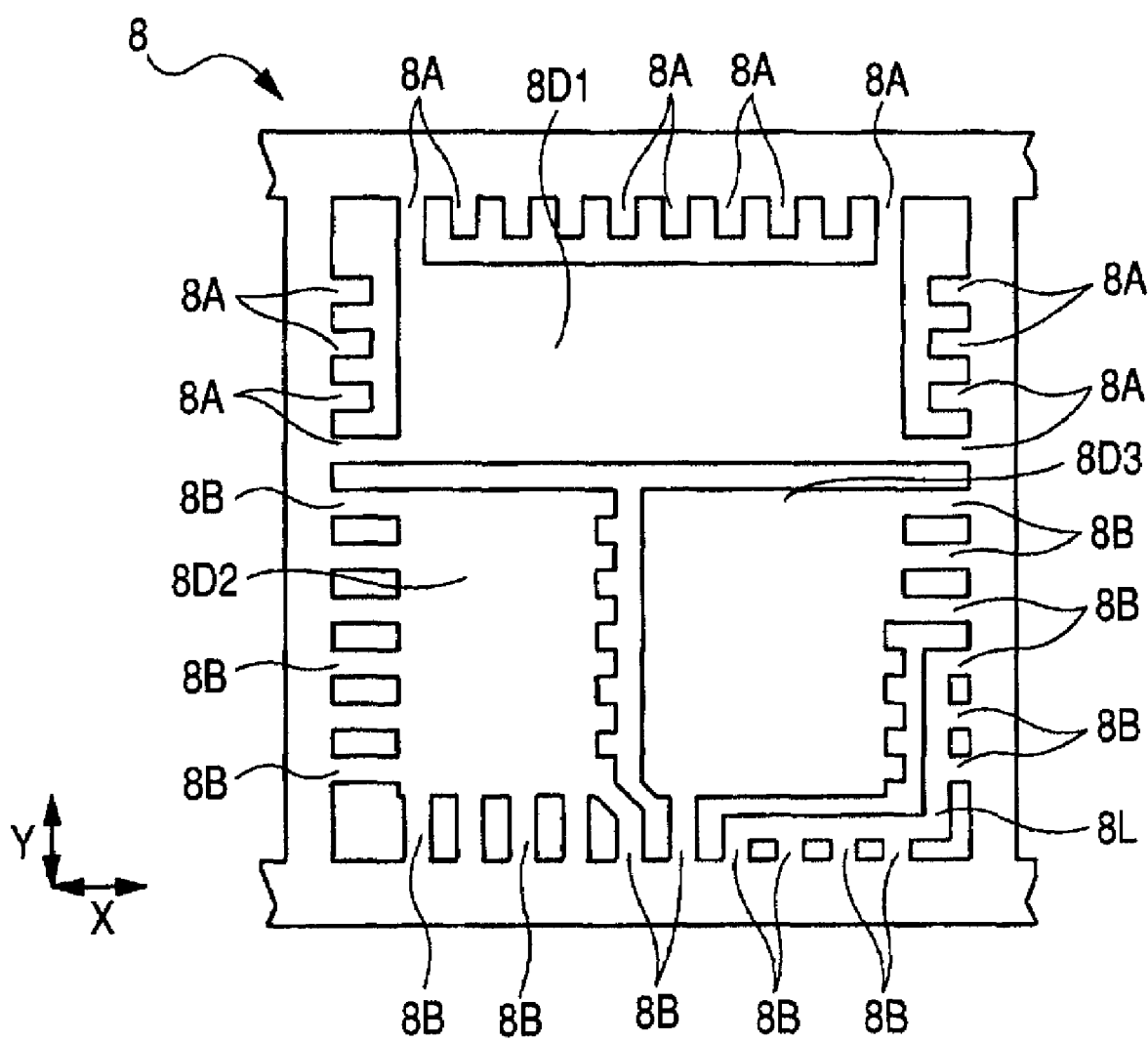
FIG. 16 is an enlarged plan view of a unit device area of a lead frame for a semiconductor device for a relatively small output current.
Figure 17:
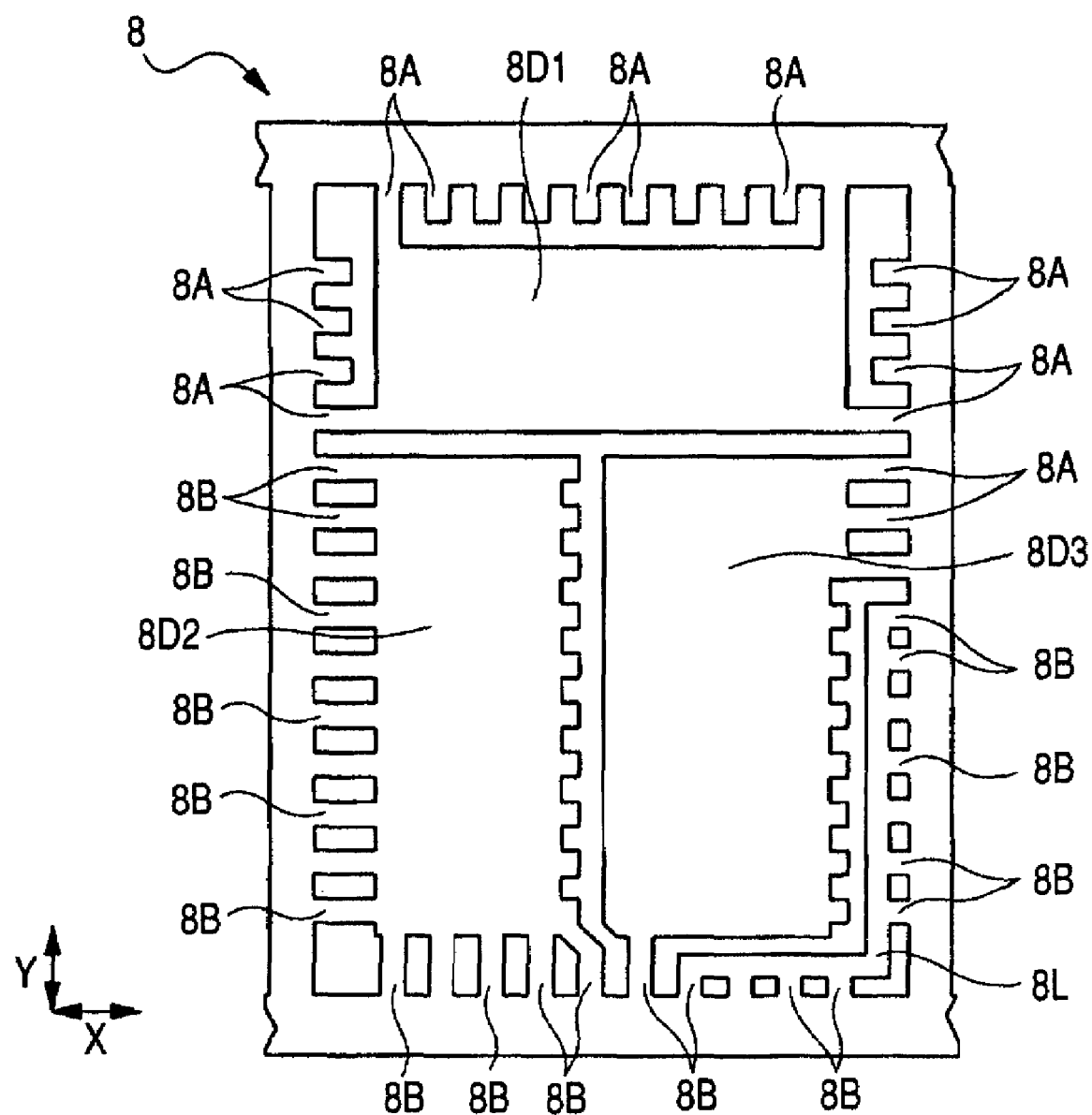
FIG. 17 is an enlarged plan view of a unit device area of a lead frame for a semiconductor device for a relatively large output current.

First, as shown in FIGS. 16 and 17, lead frames 8 (wiring boards) are prepared (step 100 in FIG. 15).

FIG. 16 is an enlarged plan view of a unit device area of a lead frame 8 for a semiconductor device for a relatively small output current. FIG. 17 is an enlarged plan view of a unit device area of a lead frame 8 for a semiconductor device for a relatively large output current.

The lead frames 8 are mainly made of a metallic material, for example, 42 alloy. Even though FIGS. 16 and 17 each show only a unit device area, the lead frames 8 each include plural unit device areas integrally connected and arranged along the first direction X. In each of the unit device areas of the lead frames 8, the leads 8A and 8B, the die pads 8D1 to 8D3, and the lead wire 8L are integrally formed.

In the first embodiment, the unit device areas of the lead frames 8 are identical in terms of the layout and numbers of the leads 8A and the dimensions of the die pad 8D1, but they differ in terms of the layout and numbers of the leads 8B and the dimensions of the die pads 8D2 and 8D3. The unit device areas of the lead frames 8 are also identical as to their dimensions in the first direction X and the numbers counted in the first direction X of the leads 8A and 8B, but they differ as to the dimensions in the second direction Y of the die pads 8D2 and 8D3 and the lead wire 8L, and the numbers counted in the second direction Y of the leads 8B. Namely, the dimensions in the second direction Y of the die pads 8D2 and 8D3 and the lead wire 8L included in each of the unit device areas of the lead frame 8 for a semiconductor device for a larger output current are larger than those of the die pads 8D2 and 8D3 and the lead wire 8L included in each of the unit device areas of the lead frame 8 for a semiconductor device for a smaller output current. Also, each of the unit device areas of the lead frame 8 for a semiconductor device for a larger output current includes a larger number of leads 8B than each of the unit device areas of the lead frame 8 for a semiconductor device for a smaller output current.

When the lead frames 8 for semiconductor devices PD to provide different amounts of output current are required, they are designed in the following manner. Namely, of the plural leads 8A and 8B of the lead frames 8, the layout and number of the leads 8A to be electrically connected to the semiconductor chip 4C for the control circuit and the dimensions and shape of the die pad 8D1 are fixed. The layout and number of the leads 8B to be electrically connected to the semiconductor chips 4PH and 4PL for the power transistors, and the dimensions in the second direction Y of the die pads 8D2 and 8D3 are arranged to be variable.

Figure 18:
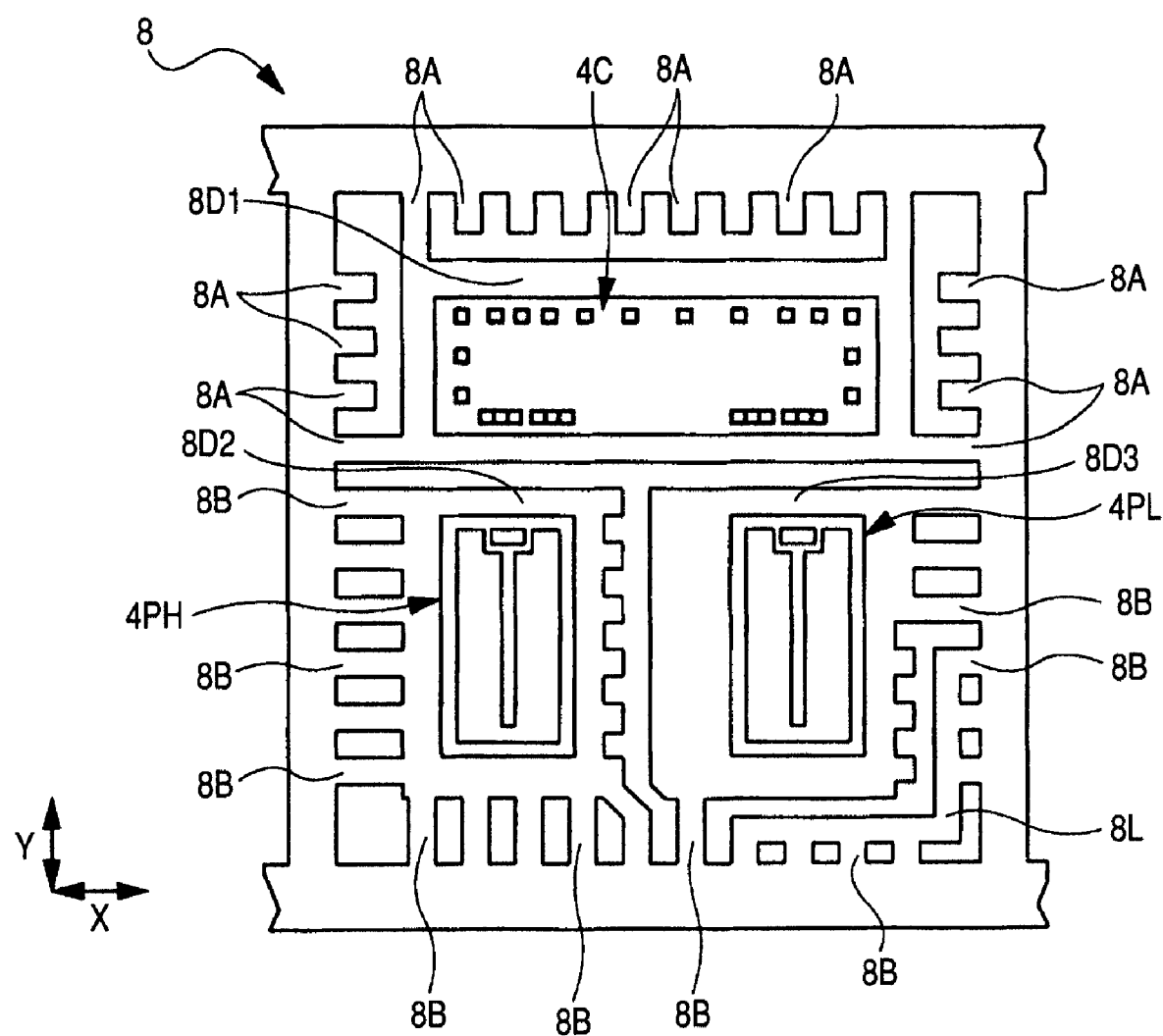
FIG. 18 is an enlarged plan view of a unit device area, mounted with semiconductor chips, of a lead frame for a semiconductor device for a relatively small output current.
Figure 19:
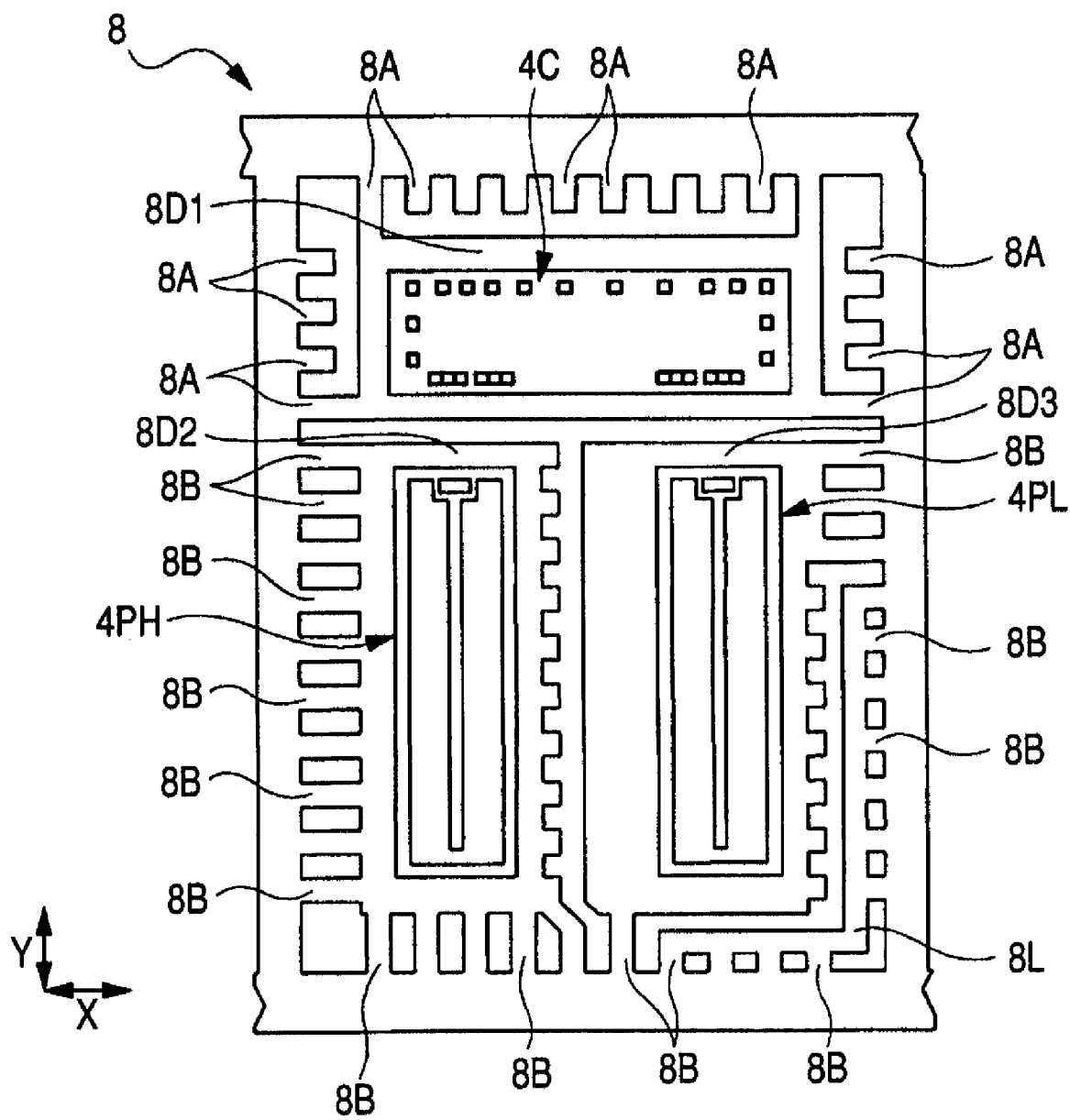
FIG. 19 is an enlarged plan view of a unit device area, mounted with semiconductor chips, of a lead frame for a semiconductor device for a relatively large output current.

Next, as shown in FIGS. 18 and 19, the semiconductor chips 4C, 4PH and 4PL are mounted on the die pads 8D1, 8D2 and 8D3, respectively, in each of the unit device areas of the lead frames 8 (step 101 in FIG. 15). FIG. 18 is an enlarged plan view of a unit device area, mounted with the semiconductor chips, of the lead frame 8 for a semiconductor device for a relatively small output current. FIG. 19 is an enlarged plan view of a unit device area, mounted with the semiconductor chips, of the lead frame 8 for a semiconductor device for a relatively large output current.

The semiconductor chips 4C for the control circuit mounted on the die pads 8D1 in a unit device area of the lead frames 8 shown in FIGS. 18 and 19, respectively, are identical to each other. The semiconductor chips 4PH and 4PL for the power transistors mounted on the die pads 8D2 and 8D3 in a unit device area of the lead frame 8 shown in FIG. 19 are larger in their dimensions in the second direction Y (that is, larger in gate width and more powerful) than those mounted on the die pads 8D2 and 8D3 in a unit device area of the lead frame 8 shown in FIG. 18.

Figure 20:
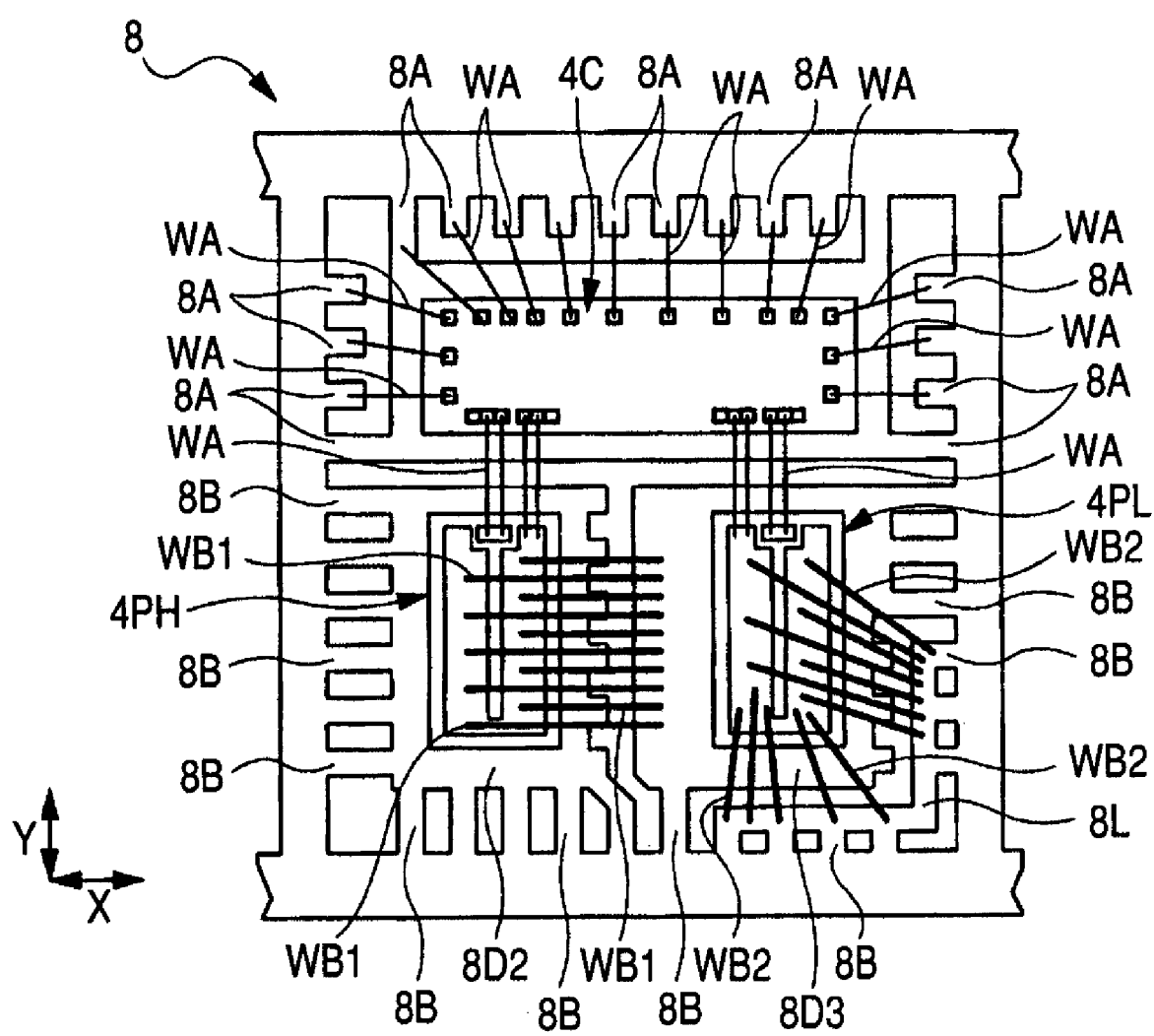
FIG. 20 is an enlarged plan view of a unit device area, having been wire-bonded, of a lead frame for a semiconductor device for a relatively small output current.
Figure 21:
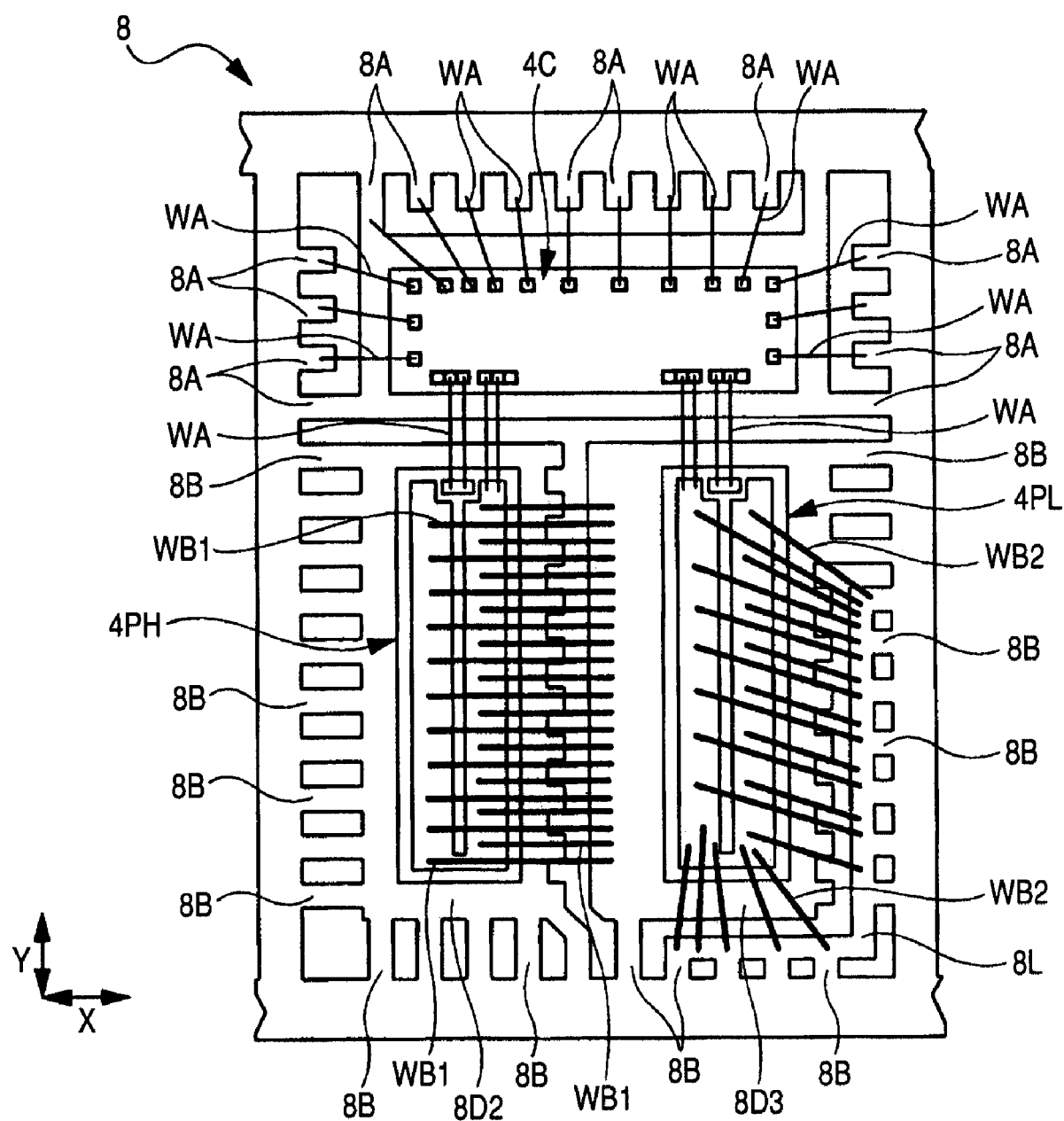
FIG. 21 is an enlarged plan view of a unit device area, having been wire-bonded, of a lead frame for a semiconductor device for a relatively large output current.

Next, as shown in FIGS. 20 and 21, the wires WA, WB1 and WB2 are connected (step 102 in FIG. 15). FIG. 20 is an enlarged plan view of a unit device area, having been wire-bonded, of the lead frame 8 for a semiconductor device for a relatively small output current. FIG. 21 is an enlarged plan view of a unit device area, having been wire-bonded, of the lead frame 8 for a semiconductor device for a relatively large output current.

Subsequently, the semiconductor chips 4C, 4PH, and 4PL, the wires WA, WB1, and WB2, portions of the die pads 8D1 to 8D3, and portions of the leads 8A and 8B in each of the unit device areas of the lead frames 8 are molded, for example, by the transfer mold method (step 103 in FIG. 15) to form packages 5. Next, after the surfaces of the packages 5 are marked (step 104 in FIG. 15), the portions exposed from the packages 5 of the leads 8A and 8B are cut off in the lead frames 8, and semiconductor devices PD are cut out from the lead frames 8 (step 105 in FIG. 15). The semiconductor devices PD to provide different amounts of output current obtained by the above process are subsequently mounted on the wiring substrate 15 as required to manufacture a desired electronic device.

Second Embodiment

Figure 22:
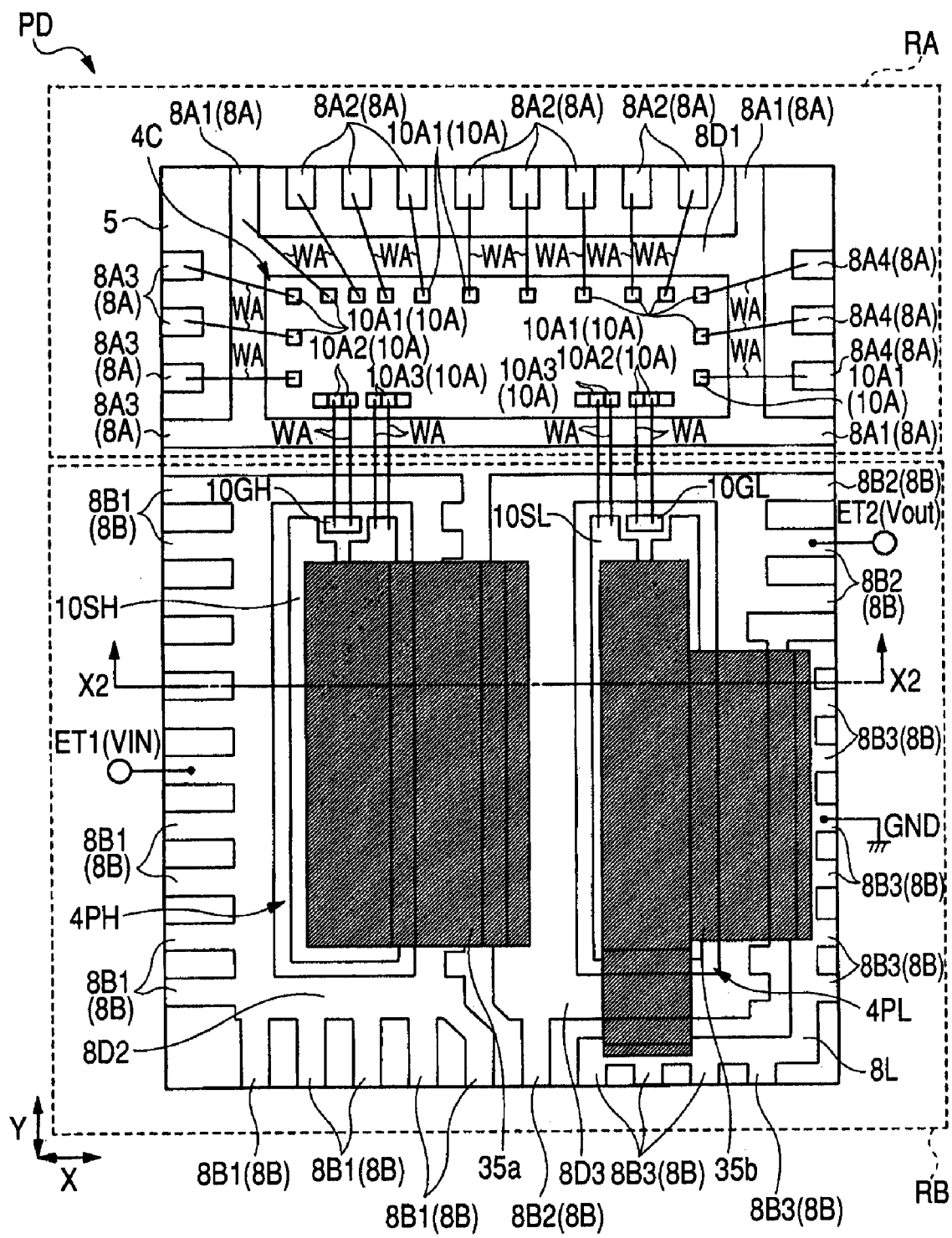
FIG. 22 is an overall top plan view of a semiconductor device according to a second embodiment of the present invention.
Figure 23:
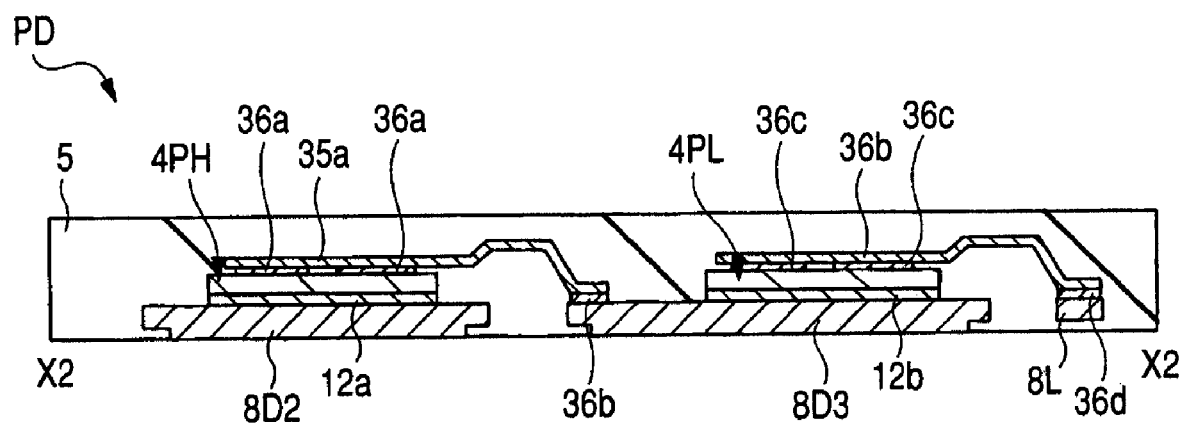
FIG. 23 is a cross-sectional view taken along line X2-X2 in FIG. 22.

FIG. 22 is an overall top plan view of a semiconductor device PD according to a second embodiment of the present invention. FIG. 23 is a cross-sectional view taken along line X2-X2 in FIG. 22. The overall plan view of the back surface of the semiconductor device PD shown in FIG. 22 is the same as FIG. 5. In FIG. 22, for convenience of explanation, the package 5 is shown as being transparent, giving a view of the package interior. Also in FIG. 22, lead plates 35a and 35b are hatched for better viewability.

In the second embodiment, the lead plates 35a and 35b are used instead of the wires WB1 and WB2 used in the first embodiment. In other respects, the configuration of the second embodiment is the same as that of the first embodiment.

The lead plates 35a and 35b are each made of a metallic plate having high electrical conductivity and thermal conductivity, for example, a cupper (Cu) or aluminum (Al) plate. They are disposed such that they cover most parts of the principal surfaces of the semiconductor chips 4PH and 4PL that generate heat. The lead plates 35a and 35b are sealed in the package 5.

One end of the lead plate 35a is joined to and electrically connected to the pad 10SH for the source electrode of the semiconductor chip 4PH via a junction layer 36a. The other end of the lead plate 35a is joined to and electrically connected to the die pad 8D3 via a junction layer 36b.

One end of the lead plate 35b is joined to and electrically connected to the pad 10SL for the source electrode of the semiconductor chip 4PL via a junction layer 36c. The other end of the lead plate 35b is joined to the lead wire 8L via a junction layer 36d and electrically connected to the leads 8B3.

The junction layers 36a to 36d are made of, for example, lead (Pb), tin (Sn) solder, or gold (Au). They may also be made of an electrically conductive resin. The wires connected to the semiconductor chip 4C are made of the same material as the wires WA mentioned above.

Figure 24:
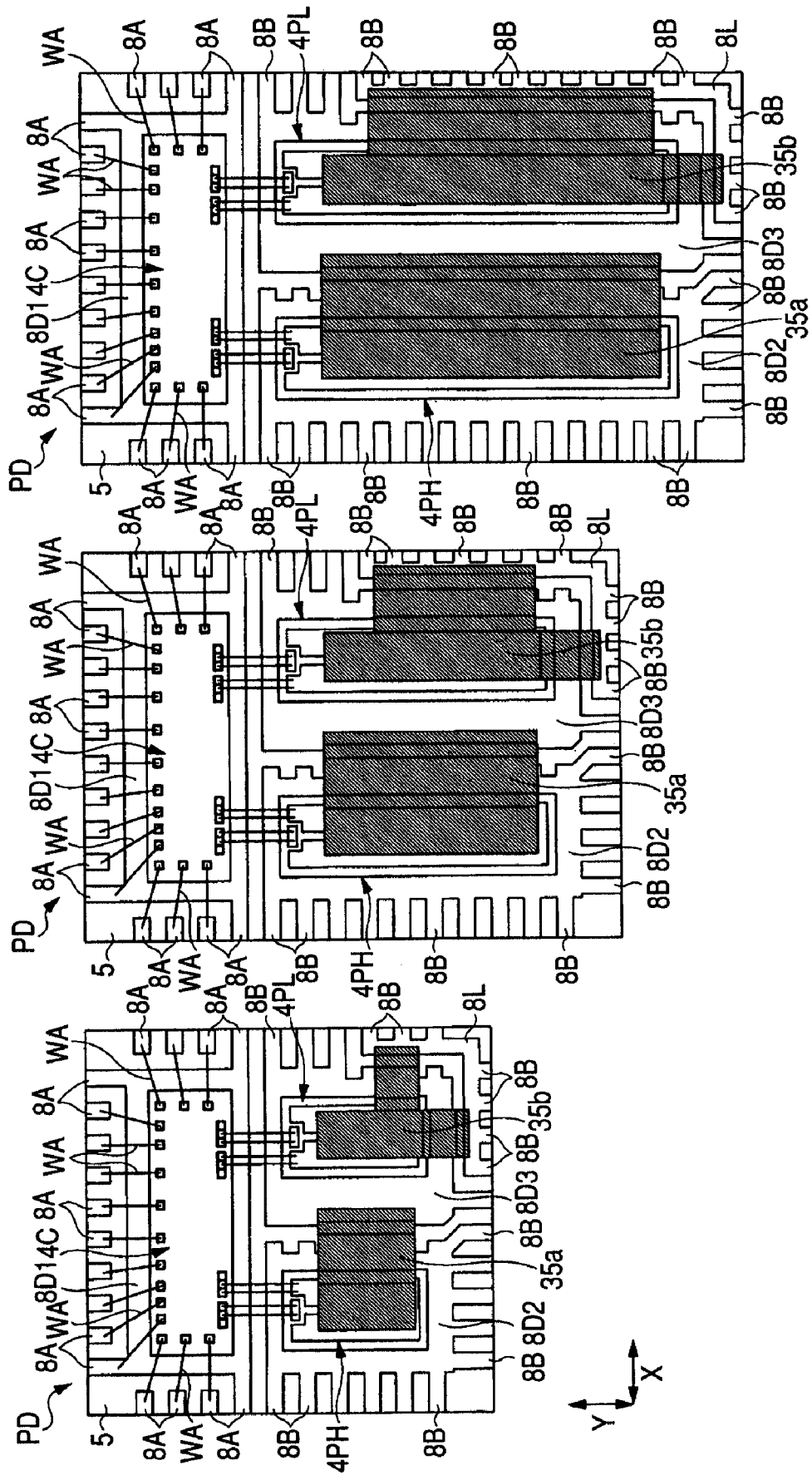
FIGS. 24(a) to 24(c) are plan views showing-an example lineup of semiconductor devices based on the one shown in FIG. 22.

FIGS. 24(a) to 24(c) show an example lineup of semiconductor devices PD according to the second embodiment. In each of FIGS. 24(a) to 24(c), for convenience of explanation, the package 5 is shown as being transparent, giving a view of the package interior. In FIG. 22, the lead plates 35a and 35b are hatched for better viewability.

The semiconductor devices PD shown in FIGS. 24(a) to 24(c) are the same as the semiconductor devices PD shown in FIGS. 8(a) to 8(c), except that the lead plates 35a and 35b are used in the former instead of the wires WB1 and WB2 used in the latter. The dimensions in the second direction Y (the direction along the second sides of the package 5) of the lead plates 35a and 35b of a semiconductor device for a larger output current are larger than those of the lead plates 35a and 35b of a semiconductor device for a smaller output current.

According to the second embodiment, with the lead plates 35a and 35b used, the parasitic inductance and parasitic resistance of the semiconductor devices can be reduced. This makes it possible to further reduce the switching loss and conduction loss of the non-insulated DC/DC converter 1 and further improve the voltage conversion efficiency of the non-insulated DC/DC converter 1.

Third Embodiment

In the first and second embodiments, for a semiconductor device to provide a larger amount of output current, the semiconductor chips 4PH and 4PL for the power transistors are made larger in one direction to increase their gate widths. As the semiconductor chips 4PH and 4PL are made increasingly large, however, they are subjected to increasingly large stress, possibly resulting in broken joints between the semiconductor chips 4PH and 4PL and the die pads 8D2 and 8D3, respectively. This makes it difficult to secure reliability of the semiconductor chips.

In the third embodiment, a semiconductor chip for a power transistor is divided into two. This reduces the stress applied to the semiconductor chip for a power transistor, so that reliability of the semiconductor chip can be enhanced. In other respects, the configuration of the third embodiment is the same as those of the first and second embodiments.

Figure 25:
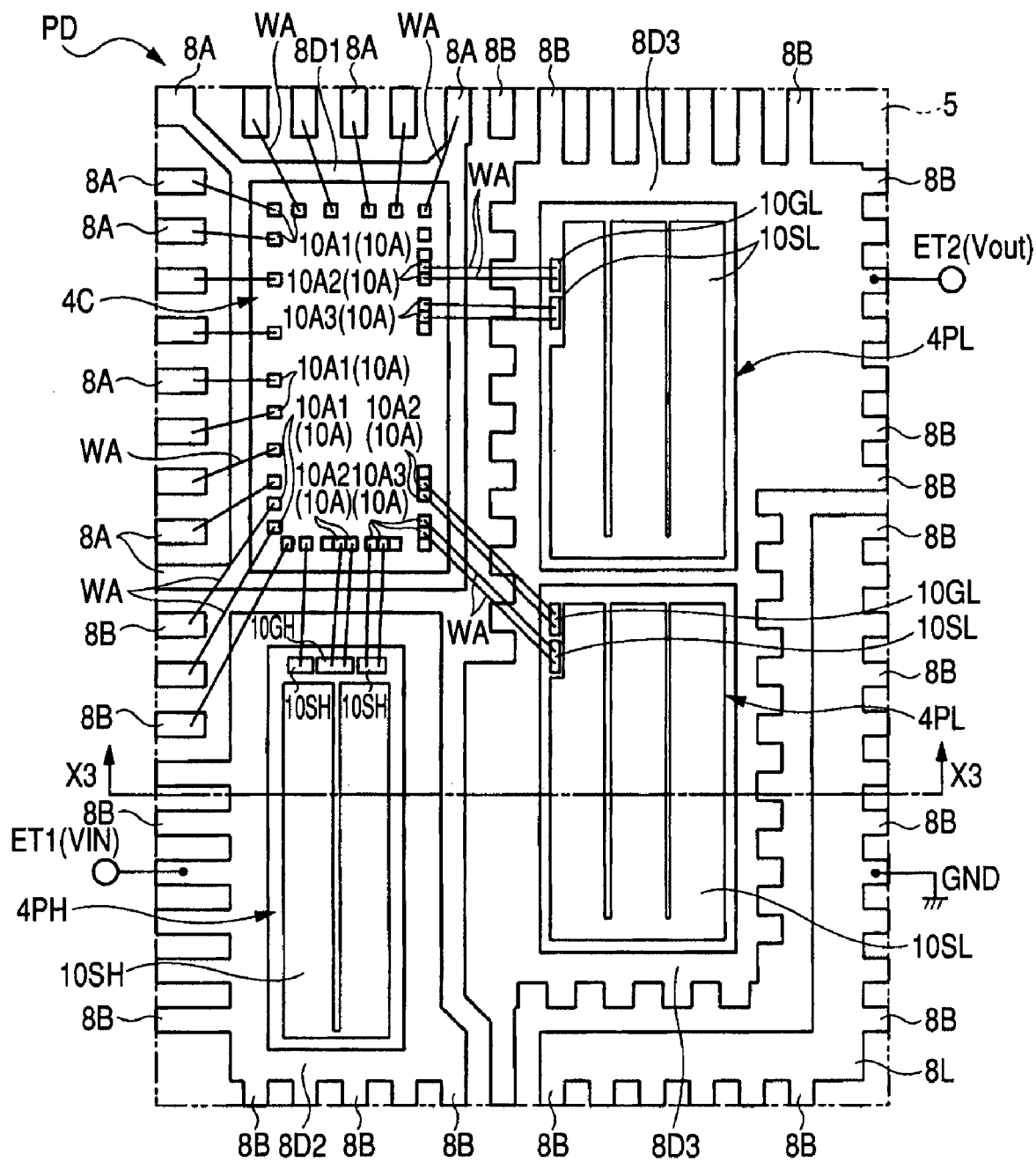
FIG. 25 is a plan view of a semiconductor device, the semiconductor device having come through a wire bonding process.
Figure 26:
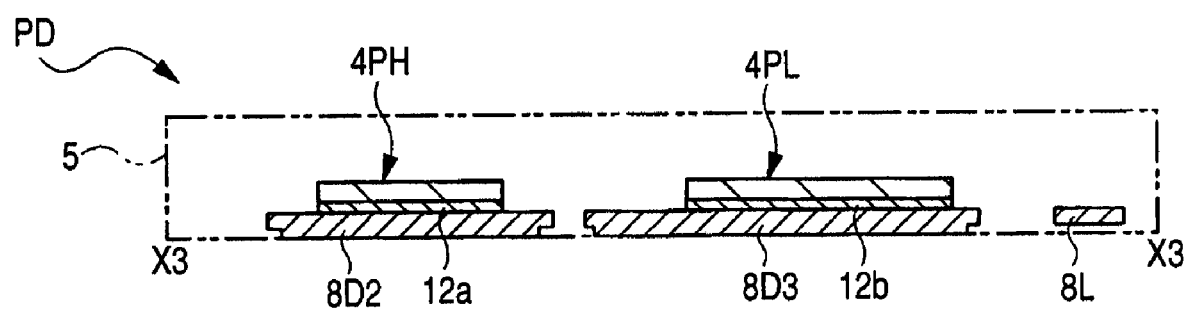
FIG. 26 is a cross-sectional view taken along line X3-X3 in FIG. 25.
Figure 27:
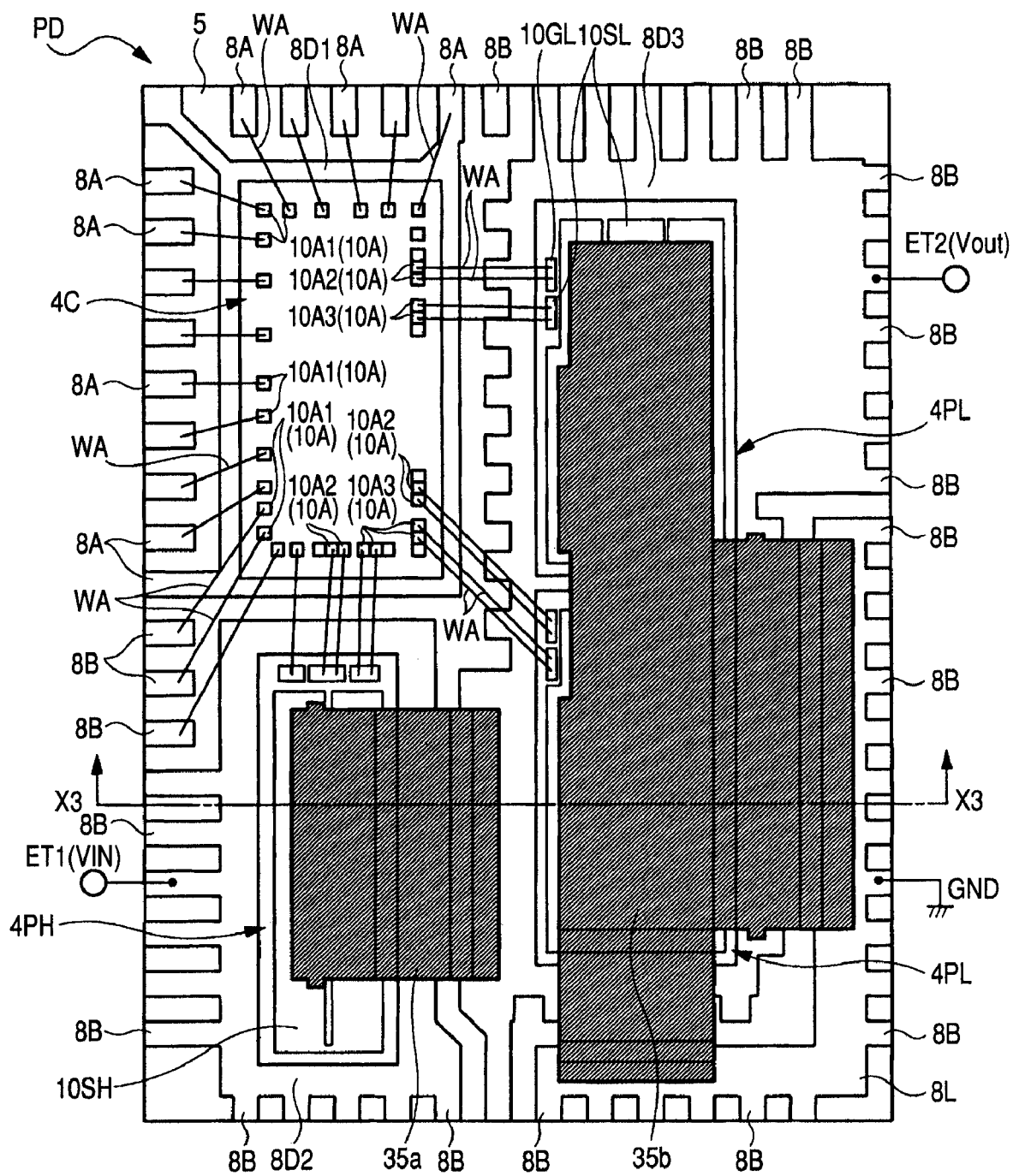
FIG. 27 is an overall plan view of the semiconductor device shown in FIG. 25, the semiconductor device having come through a cutting process.
Figure 28:
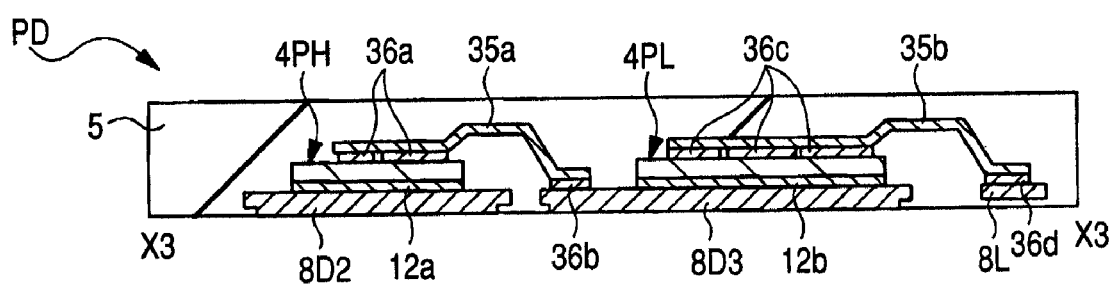
FIG. 28 is a cross-sectional view taken along line X3-X3 in FIG. 27.

FIG. 25 is a plan view of the semiconductor device PD according to the third embodiment, the semiconductor device PD having come through a wire bonding process of step 102 shown in FIG. 15. FIG. 26 is a cross-sectional view taken along line X3-X3 in FIG. 25. FIG. 27 is an overall plan view of the semiconductor device PD according to the third embodiment, the semiconductor device PD having come through a cutting process of step 105 shown in FIG. 15. FIG. 28 is a cross-sectional view taken along line X3-X3 in FIG. 27. In FIG. 27, for better viewability, the package 5 is shown as being transparent, giving a view of the package interior.

The plural semiconductor chips 4PL to make up the low-side power MOS QL1 are mounted on the principal surface of the die pad 8D3 with their principal surfaces facing up and their back surfaces facing the die pad 8D3. Namely, in the third embodiment, the two semiconductor chips 4PL make up the low-side power MOS QL1. Each of the semiconductor chips 4PL, includes, as in the first embodiment, plural unit transistors required to make up the low-side power MOS QL1.

The pads 10SL for the source electrodes on the principal surfaces of the two semiconductor chips 4PL are joined to a lead plate 25b via a junction layer 36c, causing the pads 10SL to be electrically connected to each other and also electrically connected to the lead wire 8L. In each of the semiconductor chips 4PL, the plural unit transistors are electrically connected in parallel. The plural unit transistors included in the two semiconductor chips 4PL make up the low-side power MOS QL1.

In the semiconductor device PD illustrated to describe the third embodiment, the semiconductor chip 4PH including the high-side power MOS QH1 and being mounted on the principal surface of the die pad 8D2 is singular. The sum of the longitudinal dimensions of the plural semiconductor chips 4PL each including a low-side power MOS QL1 is larger than the longitudinal dimension of the semiconductor chip 4PH including the high-side power MOS QH1.

Thus, in the third embodiment, with the plural semiconductor chips 4PL combined to form the low-side power MOS QL1, the stress applied to each of the semiconductor chips 4PL can be reduced. Hence, the stress applied to the adhesion layer 12b on the back surface of each of the semiconductor chips 4PL can be reduced to enhance the reliability of the semiconductor chips.

Although the invention by the present inventors has been described based on some embodiments, the invention is not limited to the embodiments. The invention can be modified in various ways without departing from the spirit of the invention.

Even though, the first to third embodiments have been described based on cases where the power MOSs each have a trench-gate structure, the power MOSs may have a different structure. They may be, for example, planar power MOSs. In cases where they are planar power MOSs, gate electrodes are disposed on the principal surface of the substrate via a gate insulating film. Channels are formed on the principal surface portions faced by the gate electrodes of the substrate. Namely, in each of the power MOSs, there is a portion where the operating current flows along the principal surface of the substrate (the principal surface extending in a direction intersecting the thickness direction of the substrate).

Even though, the third embodiment has been described based on a case where plural semiconductor chips are used to form the low-side power MOS QL1, a different arrangement may also be used. For example, the high-side power MOS QH1 may be formed of plural semiconductor chips.

Figure 29:
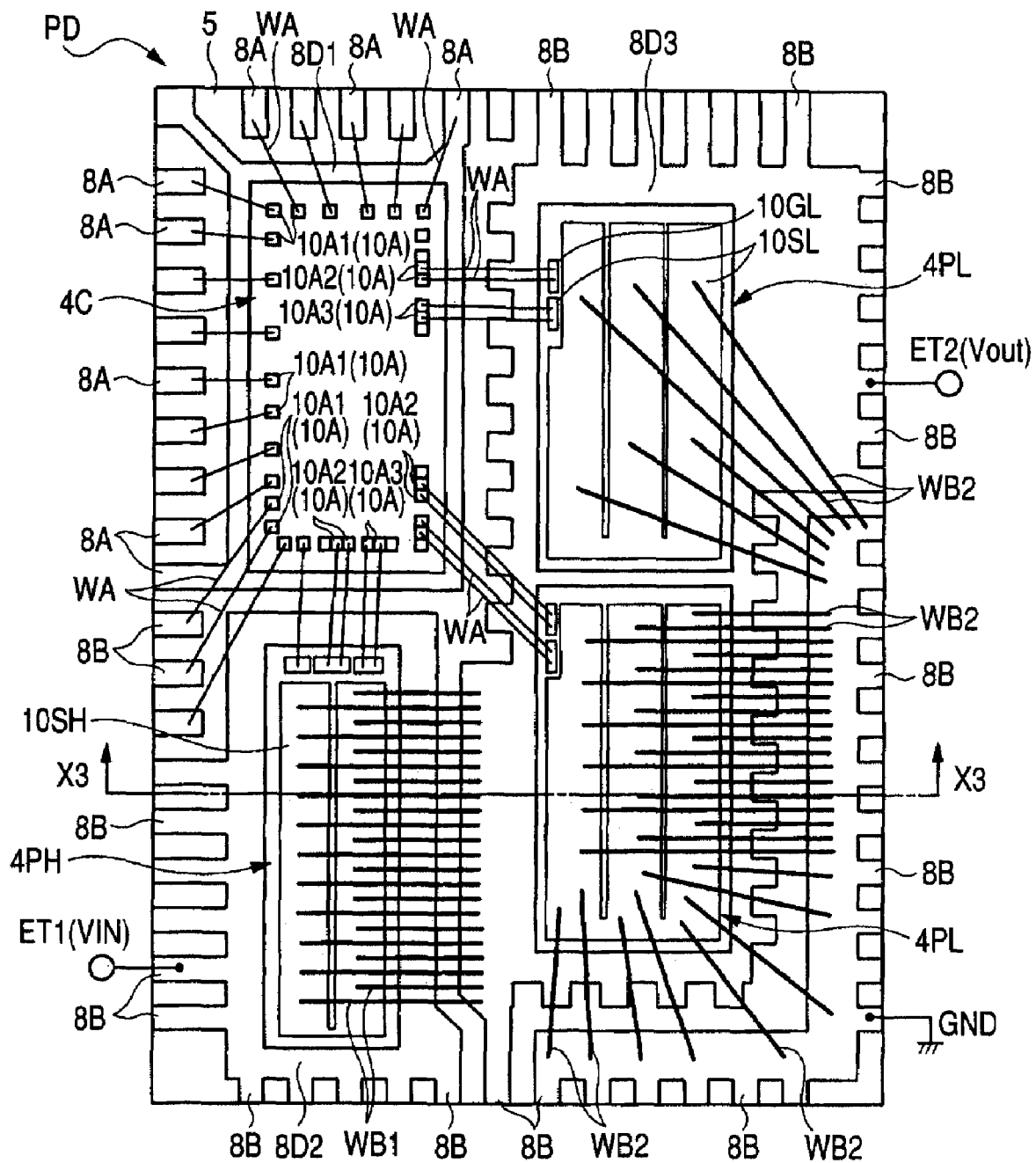
FIG. 29 is an overall plan view of a semiconductor device according to a third embodiment of the present invention, the semiconductor device having come through a cutting process.
Figure 30:
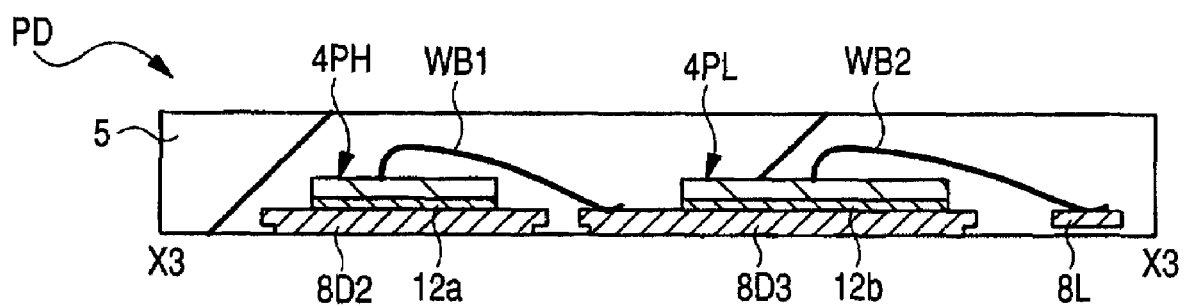
FIG. 30 is a cross-sectional view taken along line X3-X3 in FIG. 29.

Even though, in the third embodiment as described above, the lead plate 35b is connected to the pads 10SL for the source electrodes of the two semiconductor chips 4PL, a different arrangement may be used. For example, the lead plate 35b may be replaced by wires. FIG. 29 is an overall plan view of an example semiconductor device PD modified by using wires instead of the plate 35b, the semiconductor device having come through a cutting process of step 105. FIG. 30 is a cross-sectional view taken along line X3-X3 in FIG. 29. In FIG. 29, for better viewability, the package 5 is shown as being transparent, giving a view of the package interior. As shown, the pads 10SL for the source electrodes on the principal surfaces of the two semiconductor chips 4PL are electrically connected to the lead wire 8L via plural wires WB2. In this case, too, the plural unit transistors included in the semiconductor chips 4PL are electrically connected in parallel, and they as a whole make up the low-side power MOS QL1.

The above description has been mainly based on cases where the invention by the present inventors is applied to a network power supply system identified with an application field in view of which the invention has been made, but the application of the present invention is not limited to such a system. The present invention has various other applications. For example, it can also be applied to DC/DC converters for use in power supply circuits in electronic devices such as desktop personal computers, notebook personal computers, and game machines.

The present invention can be applied to semiconductor device manufacture.

What is claimed is:

1. A method of manufacturing a semiconductor device, comprising the steps of:
    (a) preparing first and second wiring substrates, each having first and second principal surfaces provided on opposite sides across a thickness thereof;
    (b) mounting a semiconductor chip for a first power transistor and a semiconductor chip for a first control circuit over the first principal surface of the first wiring substrate;
    (c) mounting a semiconductor chip for a second power transistor and a semiconductor chip for a second control circuit over the first principal surface of the second wiring substrate;
    (d) forming a first sealing body for sealing the semiconductor chip for the first power transistor and the semiconductor chip for the first control circuit; and
    (e) forming a second sealing body for sealing the semiconductor chip for the second power transistor and the semiconductor chip for the second control circuit,
    wherein an arrangement of external terminals, to be electrically connected to the semiconductor chip for the first control circuit, of the first wiring substrate and an arrangement of external terminals, to be electrically connected to the semiconductor chip for the second control circuit, of the second wiring substrate are identical, and
    wherein an arrangement of external terminals, to be electrically connected to the semiconductor chip for the first power transistor, of the first wiring substrate and an arrangement of external terminals, to be electrically connected to the semiconductor chip for the second power transistor, of the second wiring substrate are not identical.

2. The method of manufacturing a semiconductor device according to claim 1,
    wherein each of the first and second sealing bodies has first and second principal surfaces provided on opposite sides across a thickness thereof,
    wherein the first and second principal surfaces of the first and second sealing bodies are quadrilateral,
    wherein each of the first and second principal surfaces of the first and second sealing bodies has first and second sides, the first sides extending in a direction intersecting a direction in which the second sides extend,
    wherein the first sides of the first and second sealing bodies have an equal length, and
    wherein the second sides of the first sealing body are shorter than the second sides of the second sealing body.

3. The method of manufacturing a semiconductor device according to claim 2,
    wherein the first sides of the second sealing body are shorter than the second sides of the second sealing body.

4. The method of manufacturing a semiconductor device according to claim 1,
    wherein the semiconductor chip for the first power transistor and the semiconductor chip for the first control circuit are arranged such that longitudinal directions of the semiconductor chips intersect each other, and
    wherein the semiconductor chip for the second power transistor and the semiconductor chip for the second control circuit are arranged such that longitudinal directions of the semiconductor chips intersect each other.

5. The method of manufacturing a semiconductor device according to claim 1,
    wherein the semiconductor chip for the second power transistor is arranged such that the longitudinal direction thereof is along a longitudinal direction of the second sealing body.

6. The method of manufacturing a semiconductor device according to claim 1,
    wherein the semiconductor chip for the first control circuit and the semiconductor chip for the second control circuit have an equal area.

7. The method of manufacturing a semiconductor device according to claim 1,
    wherein each of the semiconductor chips for the first and second control circuits has a circuit which generates a pulse width modulation signal.

8. A method of manufacturing a semiconductor device, comprising the steps of:
    (a) preparing a wiring substrate having first and second principal surfaces provided on opposite sides across a thickness thereof; and
    (b) mounting a semiconductor chip for a power transistor and a semiconductor chip for a control circuit over the first principal surface of the wiring substrate,
    wherein the step (a) includes fixing an arrangement of external terminals, out of external terminals arranged over the second principal surface of the wiring substrate, to be electrically connected to the semiconductor chip for the control circuit and changing an arrangement of external terminals, out of the external terminals arranged over the second principal surface of the wiring substrate, to be electrically connected to the semiconductor chip for the power transistor.

9. The method of manufacturing a semiconductor device according to claim 8, wherein the semiconductor chip for the power transistor is arranged such that a longitudinal direction thereof intersects a longitudinal direction of the semiconductor chip for the control circuit, and wherein the method includes changing lengths of sides of the semiconductor chip for the power transistor.

10. The method of manufacturing a semiconductor device according to claim 9, wherein the method includes changing the lengths of sides, out of the sides of the semiconductor chip for the power transistor, which extend in a direction intersecting the longitudinal direction of the semiconductor chip for the control circuit.

* * * * *